United States Patent
Da Dalt et al.

(10) Patent No.: US 6,911,930 B1
(45) Date of Patent: Jun. 28, 2005

(54) CELL ARRAY WITH MISMATCH REDUCTION

(75) Inventors: Nicola Da Dalt, Villach (AT); Peter Gregorius, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/737,728

(22) Filed: Dec. 15, 2003

(51) Int. Cl.⁷ ............................................. H03M 1/12
(52) U.S. Cl. ................................ 341/155; 341/156
(58) Field of Search ........................ 341/155, 156, 341/159, 158, 160, 118, 120

(56) References Cited

U.S. PATENT DOCUMENTS 6,204,794 B1 * 3/2001 Bult ............................ 341/155
6,452,152 B1 * 9/2002 Yang ........................ 250/208.1

* cited by examiner

*Primary Examiner*—Peguy JeanPierre
*Assistant Examiner*—Joseph Lauture
(74) *Attorney, Agent, or Firm*—Maginot, Moore & Beck

(57) ABSTRACT

A cell array has a plurality of cell elements integrated in a wafer in a bidimensional cell matrix, wherein each integrated cell element comprises a mismatch between its actual physical property and a nominal property value. The mismatch of each cell element is a function of the distance of the respective cell element to a center of the cell array having a bidimensional mismatch distribution which is circular symmetric. The cell elements are connected in series in a wiring pattern along the circular symmetric mismatch distribution of the cell array to reduce an accumulated mismatch.

17 Claims, 25 Drawing Sheets

STATE OF THE ART

CELL ARRAY WITH MISMATCH REDUCTION

FIELD OF THE INVENTION

The invention refers to a cell array having a plurality of cell elements integrated on a wafer in a bidimensional cell matrix, in particular a cell array integrated into a digital to analog converter (DAC).

BACKGROUND

A digital to analog converter (DAC) converts a digital input data word comprising several data bits and outputs an analog output which is proportional to the value of the input binary data word. The analog output signal is e.g. a current, a voltage, a charge or an analog signal or a frequency proportional to the value of the input data word.

An ideal digital to analog converter has an input-output characteristic which is a straight line through the origin as can be seen in FIG. 1. In the digital to analog converter (DAC) according to the state of the art, the actual input-output characteristic is a line which deviates from the ideal straight line, i.e. the input-output characteristic of the conventional digital to analog converter according to the state of the art is a non-linear input-output characteristic. The non-linearity of the input-output characteristic of the conventional digital to analog converter is due to offset and gain errors. Digital to analog converters are integrated circuits which are in most cases implemented as digital to analog converters having an array of cell elements which actually perform the conversion from the digital value to the analog signal. These cell array elements comprise a plurality of cell elements, such as current sources, capacitors, resistors, which are switched by means of switches controlled by the digital input data to be converted. A digital to analog converter (DAC) having a cell array consisting of current sources is designated as a current switch digital to analog converter a (DAC) comprising a cell array of resistor elements is referred to as a resistor string digital to analog converter, and a digital to analog converter (DAC) having a cell array consisting of capacitors and is referred to as a charge redistribution digital to analog converter.

Depending on the application of the digital to analog converter, the cell array is organized substantially in three different possible ways, i.e. as a binary-weighted array, as a thermometric array or as a mixed array.

In the binary-weighted cell array, the dimension of the cell elements goes as the power of two. In a thermometric cell array, all cell elements have the same dimension. In a mixed cell array, a part of the array is thermometer-coded, and the other part of the cell array is binary-coded.

In practical integrated circuits, a mismatch among the cell elements within the cell array of a digital to analog converter exists. The mismatch, i.e. the difference between the actual physical property of the cell element and the nominal property value of the cell element, can occur for several reasons.

The first cause for the mismatch is that the wafer manufacturing process is not completely homogeneous over the whole wafer surface. As a consequence of the inhomogeneous wafer manufacturing process nominal identical cell elements which are placed on the wafer at a certain distance from each other actually show a different physical behavior. The closer the cell elements are located to each other, the lower is the mismatch between both cell elements. For this reason, it is common practice to limit the extension of the wafer area on which the cell elements of the cell array are placed. This is usually accomplished by organizing the cell elements on the wafer in a bidimensional array structure. The non-homogenity of the manufacturing process on the surface of the wafer leads to the presence of a gradient in the physical behavior of the cell elements. This means that a given physical property of the cell elements deviates from its nominal value in a more or less linear fashion along a given direction on the wafer.

In FIG. 2 a mismatch of cell elements integrated on a wafer is modeled as a bidimensional Gaussian function of the distance from the center of the cell array, wherein the mismatch is shown as a bend surface on the top part of the picture. The normalized mismatch is normalized with respect to a reference value $R_0$, such as $R_1/R_0$, wherein $R_0$ is a reference resistance value of a cell element at the center of the cell array.

Another source of mismatch among cell elements leading to a distribution as shown in FIG. 2 is the so-called "border proximity effect". In an integrated circuit, the physical property of a cell element, such as a resistor, a capacitor or a transistor, depends also on the silicon structures implemented close to it. In a bidimensional array of cell elements those cell elements which are close to the border of the cell array have a "local" silicon structure which is different from the silicon structure of the cell elements close to the center of the cell array. This causes a mismatch in the physical behavior of the cell elements. This mismatch is mainly a function of the distance of the cell element from the center of the cell array, as can be seen in FIG. 3. A digital to analog converter (DAC) comprising a cell array as shown in FIG. 3 shows a non-linearity of this input-output characteristic, wherein the non-linearity depends on how the cell array elements are connected to each other in a wiring pattern.

FIG. 3 shows a cell array having a plurality of cell elements integrated on a wafer in a bidimensional cell matrix. In the example shown in FIG. 3, the cell matrix comprises 8×8 cell elements wherein each cell element can be a resistor, a capacitor, a transistor, a current source or a diode. The mismatch distribution is circular symmetric as can be seen in FIG. 3.

FIG. 4 shows a wiring or scanning pattern for connecting the cell elements of a cell array in series according to the state of the art. The usual way of scanning or wiring a thermometer-coded digital to analog converter is performed by scanning the cell array line per line as shown in FIG. 4.

The disadvantage of this conventional wiring pattern is that, in the presence of border proximity effects, the integral or accumulated non-linearity of the digital to analog converter is high. Because the cell array is scanned line-wise the cell elements with a higher mismatch, i.e. the cell elements in row 8, as show in FIG. 4, are summed one after the other right at the beginning of the wiring or scanning sequence. Therefore, the mismatch is accumulated. By using a cell array having the wiring pattern as shown in FIG. 4, the digital to analog converter has an increased non-linearity of the input-output characteristic.

Accordingly, it is the object of the present invention to provide a cell array which has a reduced accumulated mismatch.

SUMMARY OF THE INVENTION

This object is achieved by a cell array having novel arrangements of connections and/or configurations.

One embodiment is a cell array having a plurality of cell elements integrated on a wafer in a bidimensional cell matrix, at least one integrated cell element exhibiting a mismatch between its actual physical property and a nominal property value. The mismatch of the at least one cell element is a function of the distance of the respective cell element to a center of the cell array having a bidimensional mismatch distribution. The plurality of cell elements arranged in rows and columns, and the cell elements are connected in series in a wiring pattern. For a plurality of rows of cell elements, each row of cell elements includes more than two series connections to cell elements of one or more other rows. For a plurality of columns of cell elements, each column of cell elements includes more than two series connections to cell elements of one or more other columns.

Accordingly, the above embodiment involves wiring patterns having features that reduce the accumulated mismatch.

In some embodiments, the cell matrix comprises a first number (N) of cell element rows and a second number (M) of cell element columns. Preferably, the first number (N) of cell element rows is equal to the second number (M) of cell element columns.

In some embodiments of the cell array according to the present invention, the cell array is surrounded by dummy cell elements. This provides the advantage that border effects affecting the peripheral cell elements of the cell array are suppressed.

In a preferred embodiment of the cell array according to the present invention, at least three successive elements are connected to elements displaced by one row and one column, thereby forming diagonal connections.

In further embodiments of the cell array according to the present invention, the cell elements are connected in a wiring pattern having a meandrous form.

In further embodiments of the cell array according to the present invention, the cell elements are connected in a wiring pattern having a helical form.

In further embodiments of the cell array according to the present invention, each cell element of the integrated cell array is bridgeable by a corresponding switch. In some embodiments of the cell array, the switches are provided within the integrated cell array. In other embodiments, the switches are provided outside the integrated cell array.

In certain embodiments, these elements may be capacitors, varactors, resistors, current sources, transistors, or diodes.

Another embodiment of the invention is a digital to analog converter having a cell array and a number of dummy cells. The cell array has a plurality of cell elements integrated on a wafer in a bidimensional cell matrix, at least one integrated cell element exhibiting a mismatch between its actual physical property and a nominal property value. The mismatch of the at least one cell element is a function of the distance of the respective cell element to a center of the cell array having a bidimensional mismatch distribution, the plurality of cell elements connected in series in a wiring pattern. The dummy cells extend around a perimeter of the cell array.

The dummy cells extending around the perimeter of the cell array help to reduce the accumulated mismatch of the cells in the array.

In the following, the preferred embodiments of a cell array according to the present invention are described in detail with reference to the enclosed figures.

DETAILED DESCRIPTION

Figure 5:
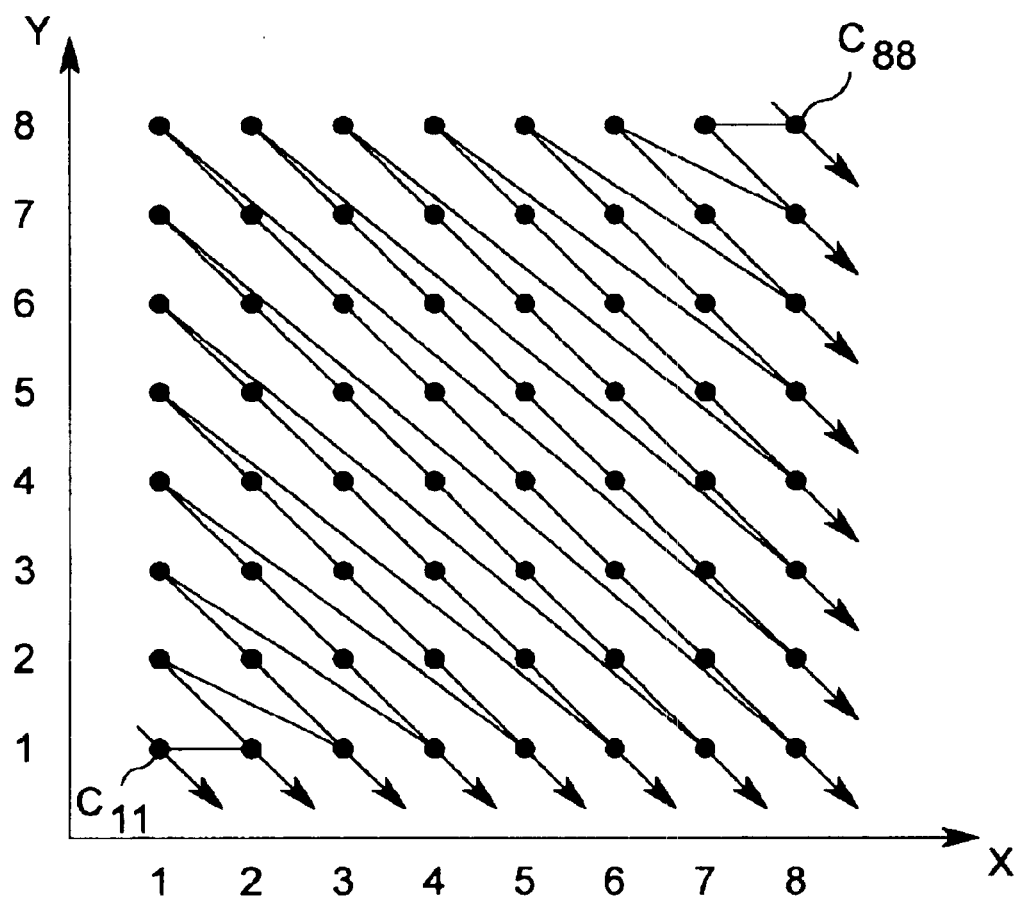
FIG. 5 shows a first wiring pattern for wiring a thermometer-coded bi-dimensional cell array according to the present invention.

FIG. 5 shows a first embodiment of a wiring pattern for connecting cell elements integrated on a wafer in a bidimensional cell matrix according to the present invention.

In the embodiment shown in FIG. 5, the cell matrix comprises 8×8 cell elements $C_{ij}$ wherein the cell elements are provided in rows and columns. In the given example, the cell matrix comprises eight cell element rows and eight cell element columns. It is preferred that the number (N) of the cell element rows is equal to the number (M) of the cell element columns.

Figure 1:
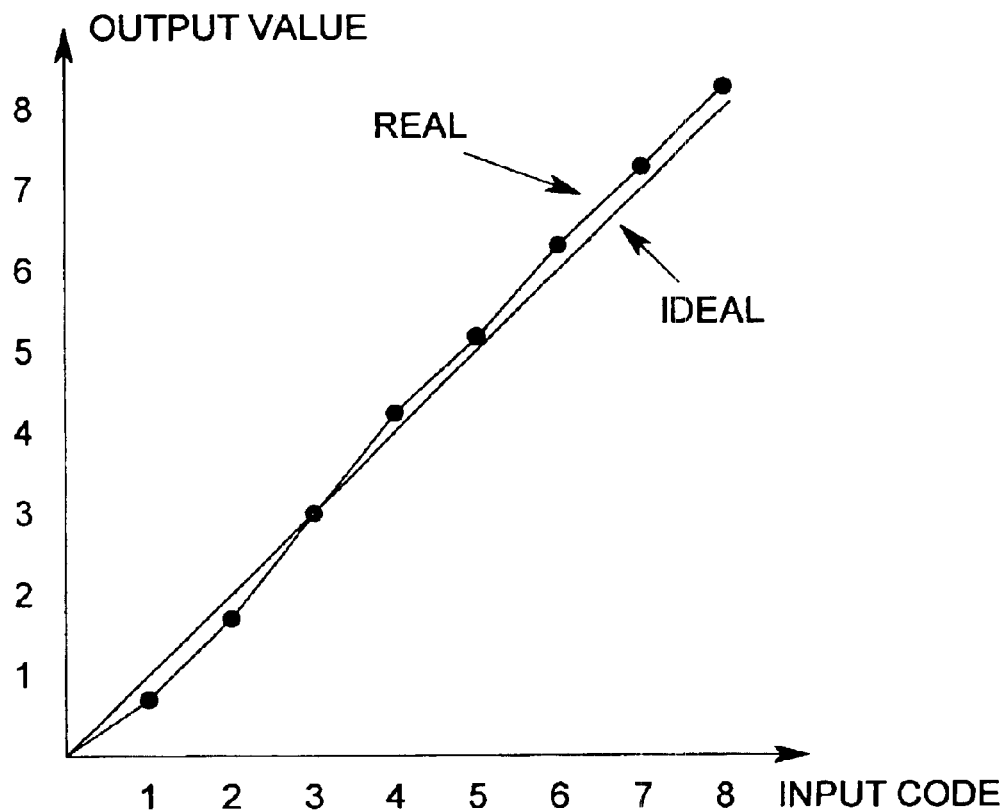
FIG. 1 shows the input-output characteristic of a digital to analog converter according to the state of the art.
Figure 2:
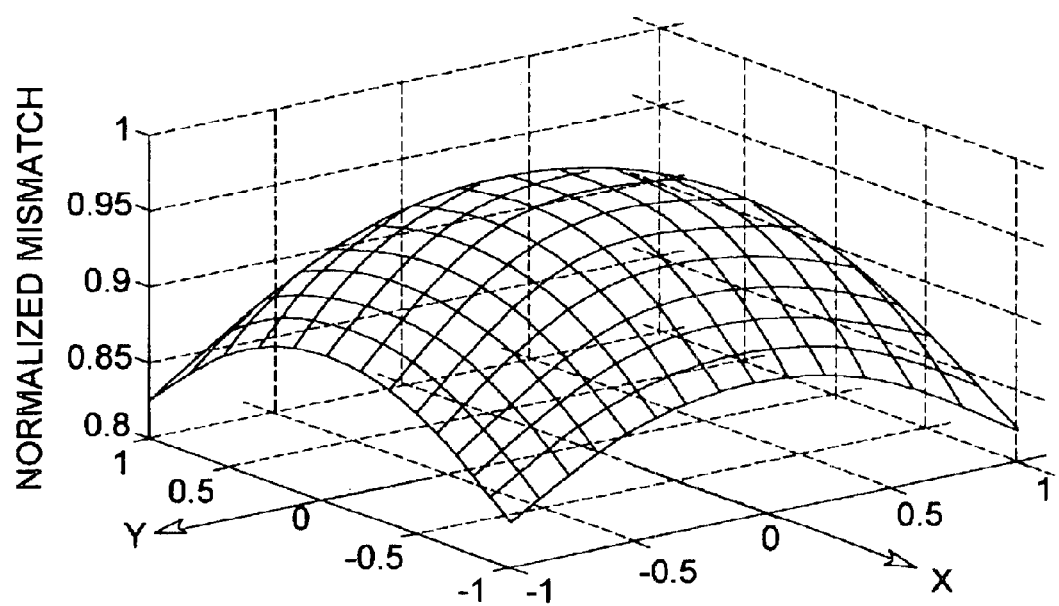
FIG. 2 shows the bidimensional mismatch distribution of a cell array according to the state of the art.
Figure 3:
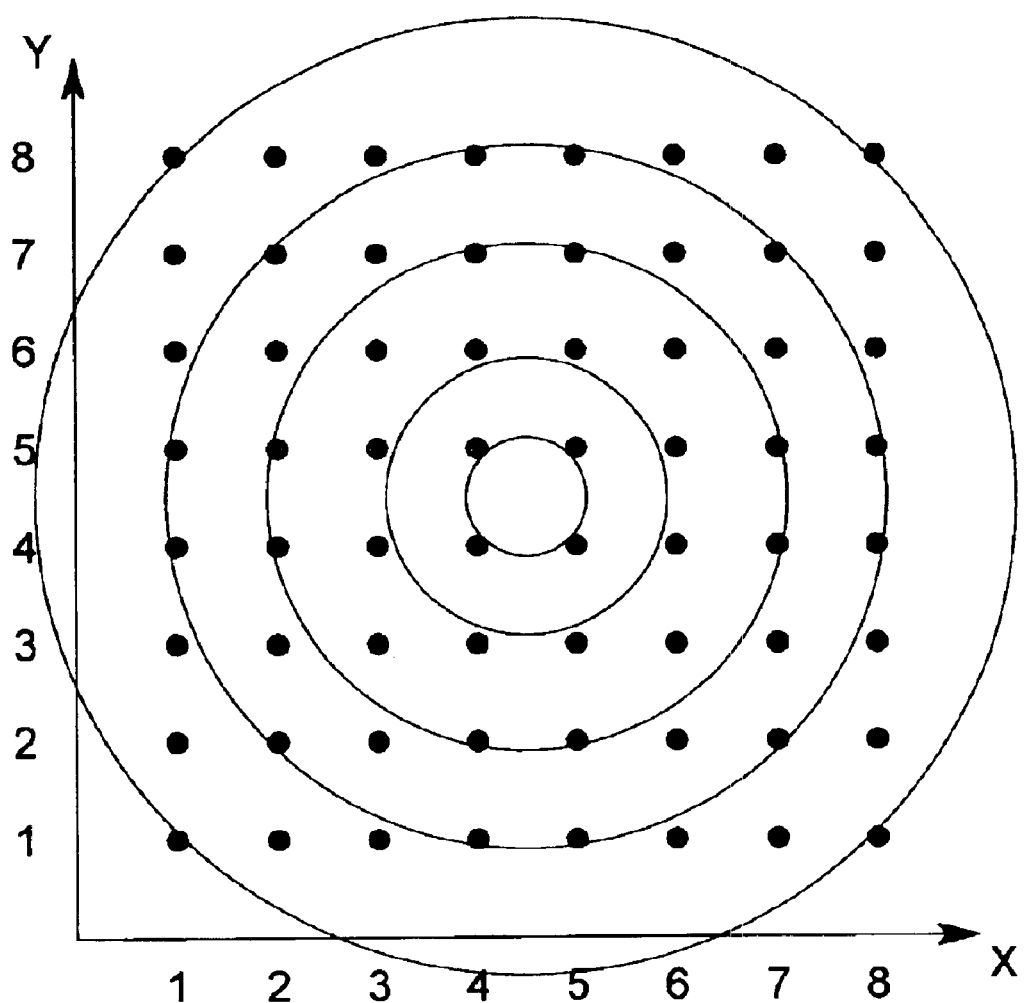
FIG. 3 shows a circular mismatch distribution of a cell array according to the state of the art.
Figure 4:
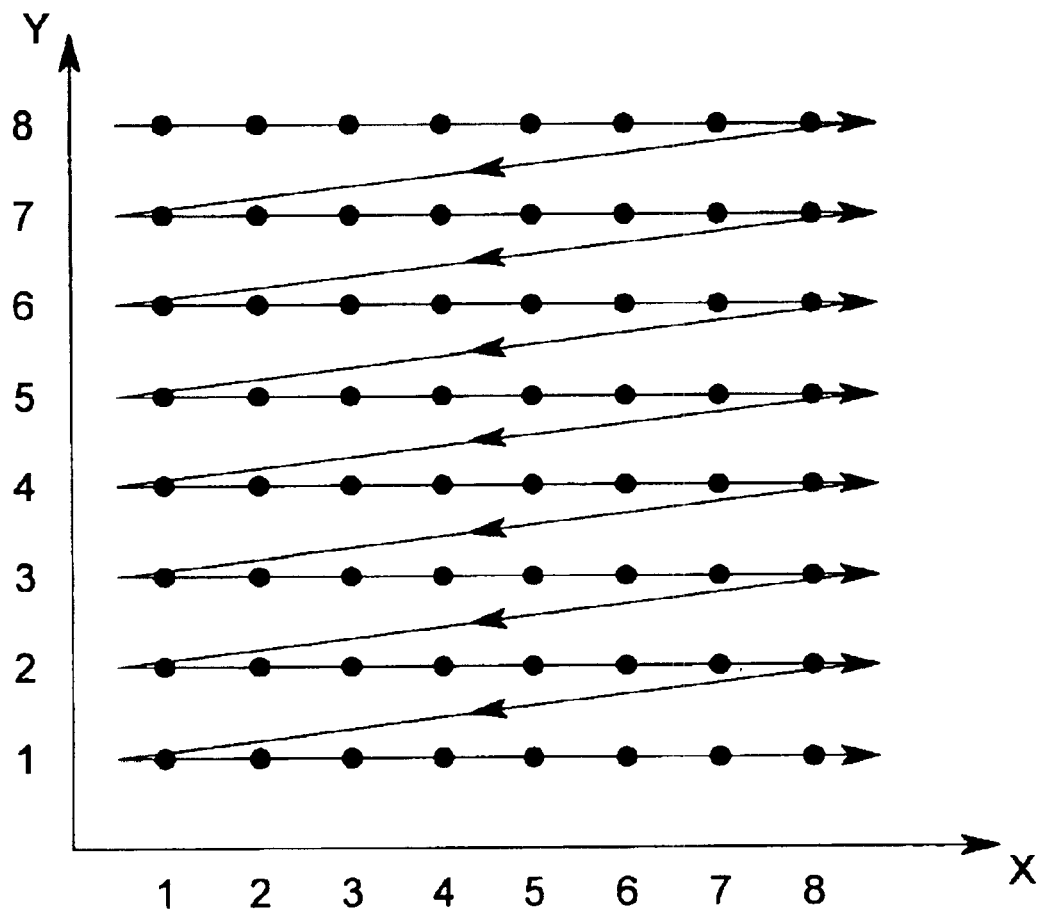
FIG. 4 shows a wiring pattern for connecting cell elements within a cell array according to the state of the art.

As can be seen from FIG. 5, in contrast to wiring the cell elements line per line (as shown in FIG. 4), the cell elements are connected to each other by moving along the diagonals of the cell array with an angle of 45 degrees. Naturally, there are several possibilities to wire the cell array using a 45-degree direction so that there are different wiring patterns possible.

In the embodiment shown in FIG. 5, the wiring starts with the cell element $C_{88}$ and ends with the cell element $C_{11}$. The advantage of wiring the cell elements along the diagonals of the cell array matrix is that the mismatch of the border cell elements such as cell element $C_{88}$ is quickly compensated for by the cell elements closer to the center of the cell array matrix which are less affected by border proximity effects and thus have lower mismatches with respect to the nominal value. In this way, the integral non-linearity of the cell array is drastically decreased.

Figure 6:
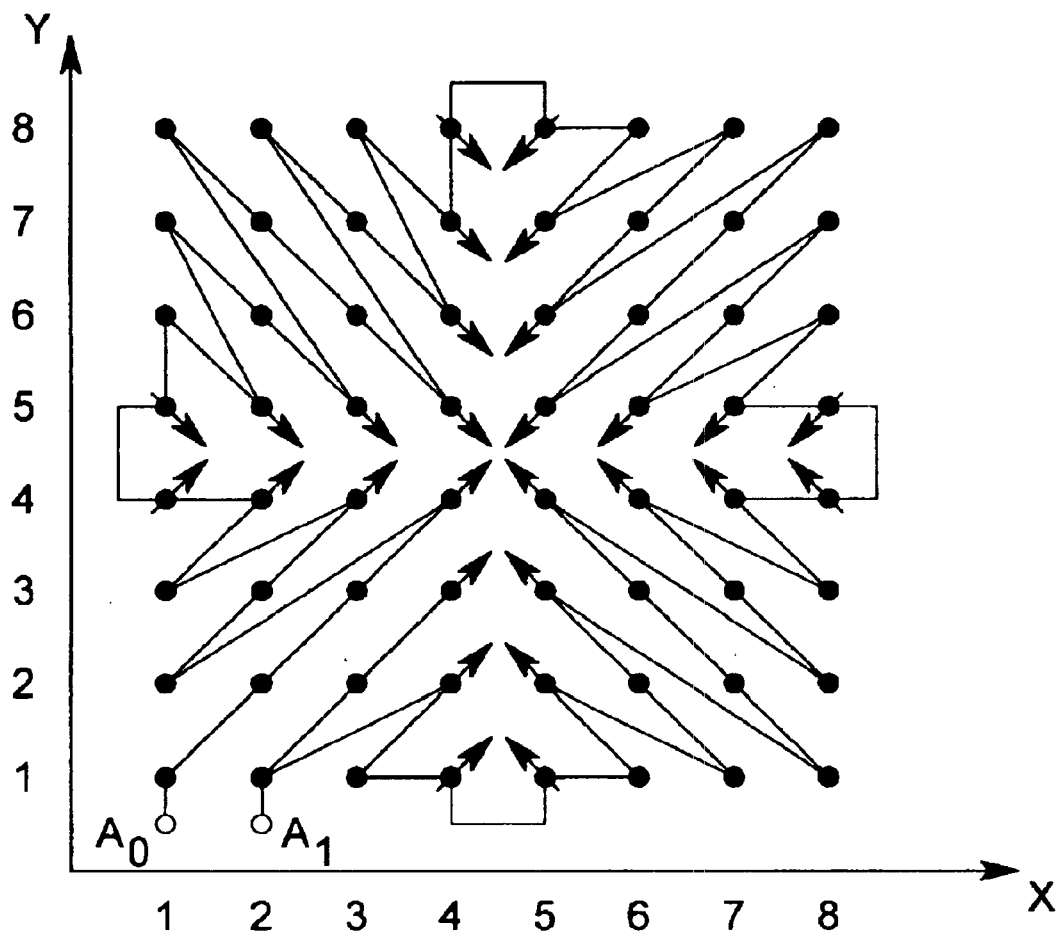
FIG. 6 shows a second wiring pattern for wiring a thermometer-coded bi-dimensional cell array according to the present invention.

FIG. 6 shows a further embodiment of the wiring pattern according to the present invention wherein the cell elements are connected along diagonals having an angle of 45 degrees with respect to the rows and columns of the matrix.

Figure 7:
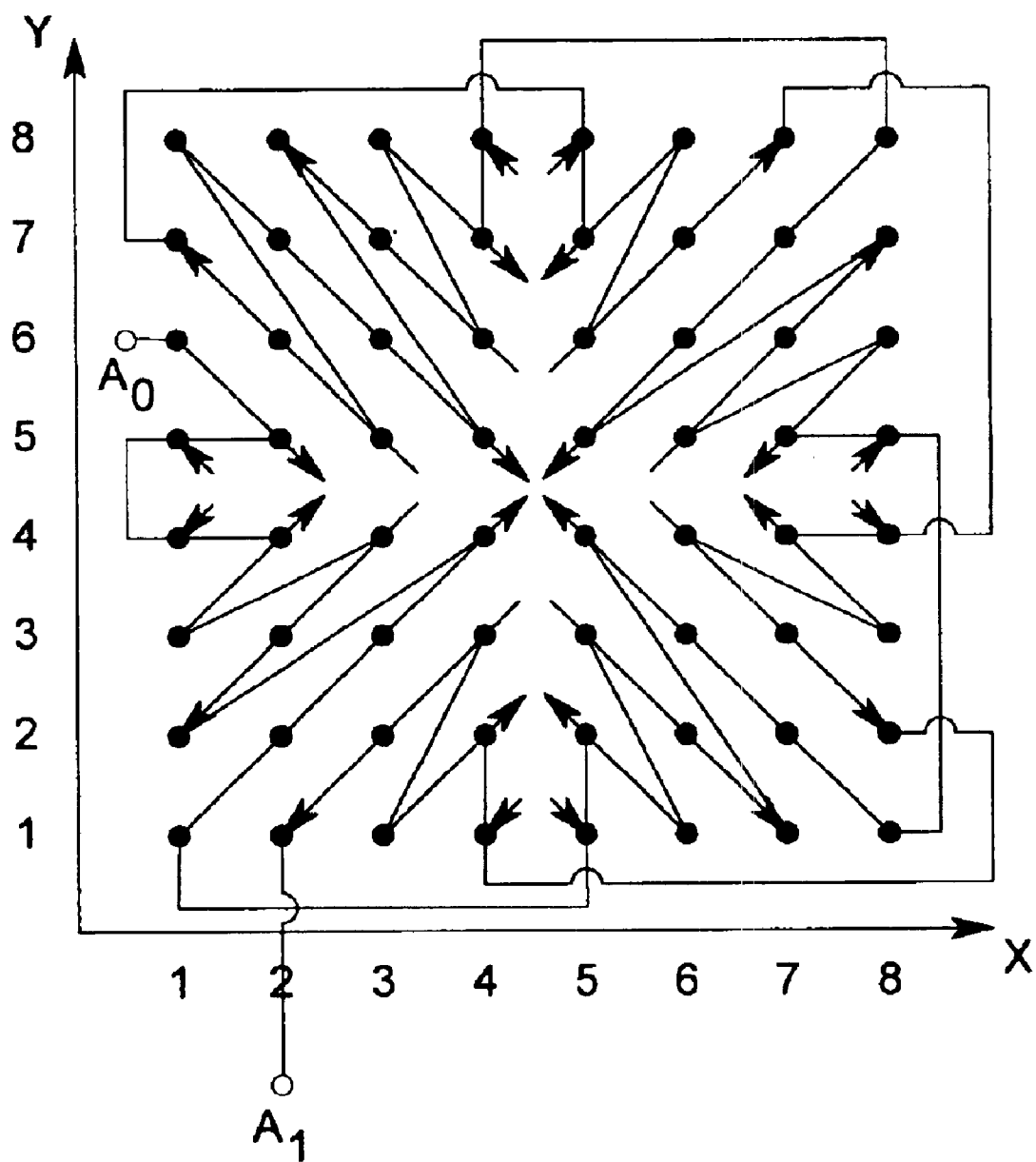
FIG. 7 shows a third wiring pattern for wiring a thermometer-coded bi-dimensional cell array according to the present invention.

FIG. 7 shows a similar wiring pattern wherein the cell elements are connected via diagonals having an angle of 45 degrees with respect to the columns and array of the cell matrix.

Figure 8:
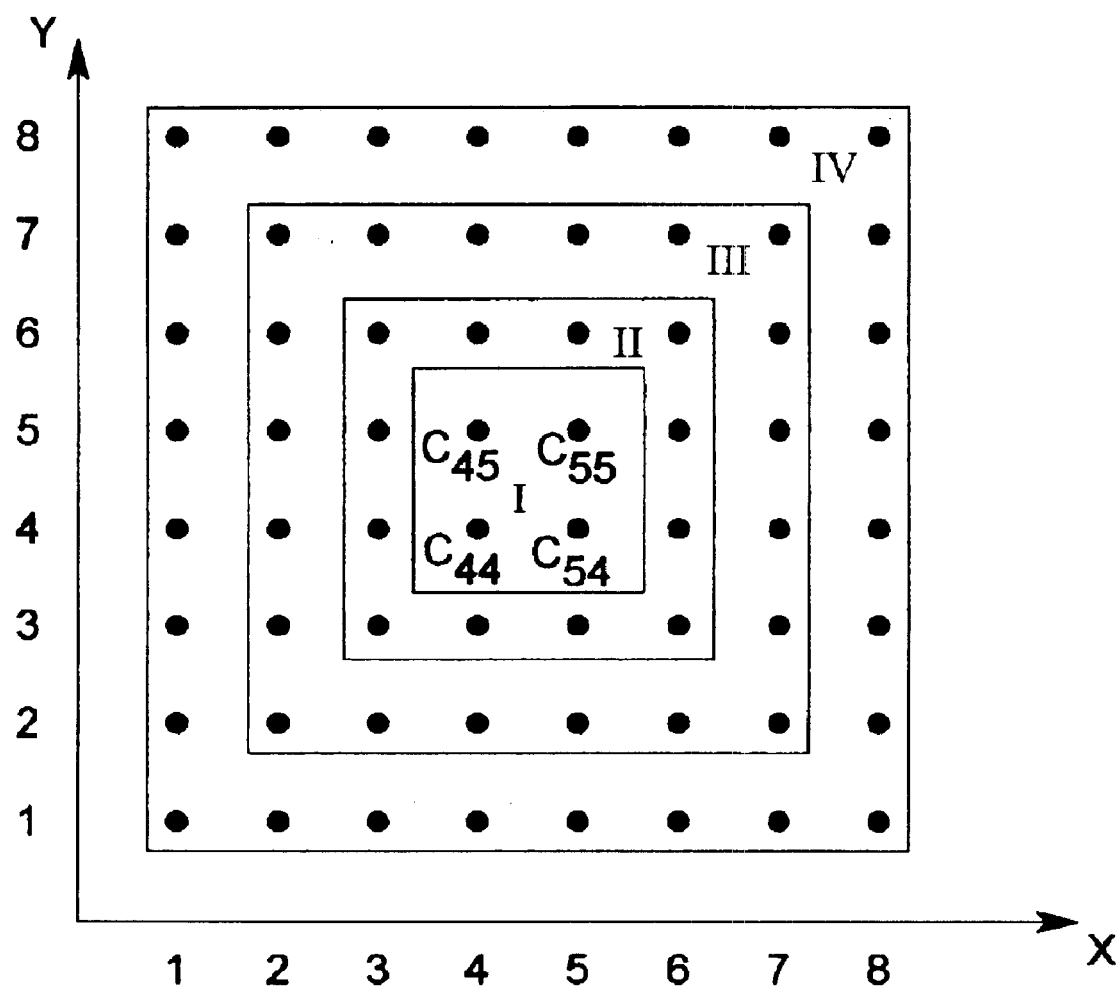
FIG. 8 shows a bidimensional cell array having regions of equal mismatch.

FIG. 8 shows a bidimensional 8×8 cell array having 64 cell elements having four regions I, II, III, IV of equal mismatch. The nominal value of each cell element is equal to 1. Due to the border proximity effect, each cell element has a mismatch which is roughly proportional to the distance of the cell element from the center of the cell matrix. With specific referral to FIG. 8, the four cell elements $C_{45}$, $C_{55}$, $C_{44}$, $C_{54}$ in the first region I have a value of $1+3*\epsilon$ where $\epsilon$ is a small value compared to one indicating a relatively small amount of mismatch. The cell elements in the second region II have a value of $1+2*\epsilon$. Further, the elements in the third region III have a value of $1+\epsilon$, while those elements in the region IV have a value of $1-96*\epsilon/28$, the sum of all values of all cells is equal to 64, so that the average cell value is equal to the nominal value 1.

If the first eight cell elements $C_{18}$, $C_{28}$, $C_{38}$, ..., $C_{88}$ are connected according to the state of the art wiring pattern as shown in FIG. 4, the output value of the digital to analog converter is $8-8*96*\epsilon/28$. The ideal output value is 8, so that the integral non-linearity error when using the conventional wiring method amounts to $-27.4*\epsilon$.

In case that the eight cell elements are connected with the wiring patent according to the present invention as shown in FIG. 6, starting with the cell element $C_{11}$.

In this case, the DAC output is $(1-96*\epsilon/28)+(1+\epsilon)+(1+2*\epsilon)+(1+3*\epsilon)+(1-96*\epsilon/28)+(1+\epsilon)+(1+2*\epsilon)+(1-96*\epsilon/28)$ The integral non-linearity error amounts in this case to a mere $-1.3*\epsilon$.

As can be seen from this example, the integral non-linearity of a cell matrix using a wiring pattern according to the present invention is drastically reduced in comparison to a conventional cell matrix having a conventional wiring pattern.

Figure 9:
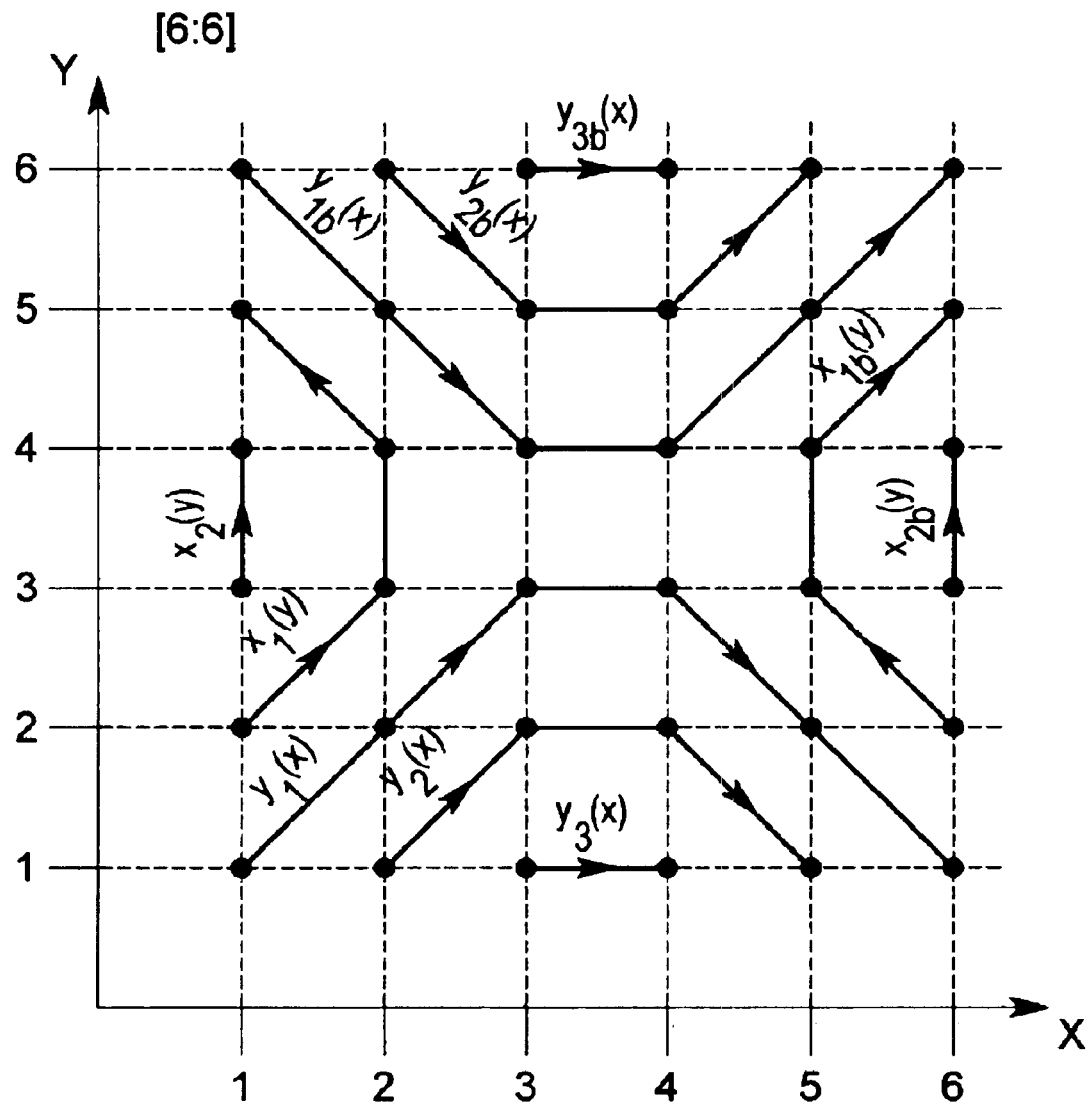
FIG. 9 shows a fourth wiring pattern for wiring a bi-dimensional cell array according to the present invention.

FIG. 9 shows a 6×6 cell matrix having 36 cell elements. When implementing a wiring process, the cell matrix is indexed by a Carthesic coordination system. The connection of the cell elements in a N×N cell matrix, the cell matrix can be divided into four regions which are defined by the following equations:

Lower region (G1)

$i \epsilon 1, \frac{n}{2}$ $x \epsilon i, n - i + 1$ $y_i(x) = \begin{vmatrix} x - i + 1 \text{ if } x \leq \frac{n}{2} \\ \text{otherwise } (n + 2 - i) - x \end{vmatrix}$ Left region (G3)

$i \epsilon 1, \frac{n}{2} - 1$ $y \epsilon i + 1, n - 1$ $x_i(y) = \begin{vmatrix} y - i \text{ if } y \leq \frac{n}{2} \\ \text{otherwise } (n + 1 - i) - y \end{vmatrix}$ Upper region (G2)

$i \epsilon 1, \frac{n}{2}$ $x \epsilon i, n - i + 1$ $y_{ib}(x) = \begin{vmatrix} (n + i - x) \text{ if } x \leq \frac{n}{2} \\ \text{otherwise } x + i - 1 \end{vmatrix}$ Right region (G4)

$i \epsilon 1, \frac{n}{2} - 1$ $x_i \epsilon i, n - i + 1$ $y_{ib}(x) = \begin{vmatrix} (n + i + 1 - y) \text{ if } y \leq \frac{n}{2} \\ \text{otherwise } y + i \end{vmatrix}$ For the 6×6 cell element matrix, ten equations are provided for wiring the cell elements.

Lower region → (G1)

$i = 1$ $x \epsilon i, n - i + 1 = \{1, 2, 3, 4, 5, 6\}$ $y_1(x) = \begin{vmatrix} x \text{ if } x \leq \frac{n}{2} \\ \text{otherwise } 7 - x \end{vmatrix}$ $y_1(x) = \{1, 2, 3, 3, 2, 1\}$ $i = 2$ $x \epsilon i, n - i + 1 = \{2, 3, 4, 5\}$ $y_2(x) = \begin{vmatrix} x - 1 \text{ if } x \leq \frac{n}{2} \\ \text{otherwise } 6 - x \end{vmatrix}$ $y_2(x) = \{1, 2, 2, 1\}$ $i = 3$ $x \epsilon i, n - i + 1 = \{3, 4\}$ $y_3(x) = \begin{vmatrix} x - 2 \text{ if } x \leq \frac{n}{2} \\ \text{otherwise } 5 - x \end{vmatrix}$ $y_3(x) = \{1, 1\}$ Upper region → (G2)

$i = 1$ $x = \{1, 2, 3, 4, 5, 6\}$ $y_{1b}(x) = \begin{vmatrix} 7 - x \text{ if } x \leq \frac{n}{2} \\ \text{otherwise } x \end{vmatrix}$ $y_{1b}(x) = \{6, 5, 4, 4, 5, 6\}$ $i = 2$ $x = \{2, 3, 4, 5\}$ $y_{2b}(x) = \begin{vmatrix} 8 - x \text{ if } x \leq \frac{n}{2} \\ \text{otherwise } x + 1 \end{vmatrix}$ $y_{2b}(x) = \{6, 5, 5, 6\}$ $i = 3$ $x = \{3, 4\}$ $y_{3b}(x) = \begin{vmatrix} (n + i - x) \text{ if } x \leq \frac{n}{2} \\ \text{otherwise } x + i - 1 \end{vmatrix}$ $y_{3b}(x) = \{6, 6\}$ Computation of the left and right region:

$i \epsilon 1, \frac{n}{2} - 1 = \{1, 2\}$

-continued

| Left region → (G3) | Right region → (G4) |
|---|---|
| $i = 1$ | $i = 1$ |
| $y = \{2, 3, 4, 5\}$ | $y = \{2, 3, 4, 5\}$ |
| $x_1(y) = \begin{vmatrix} y-1 \text{ if } y \leq \frac{n}{2} \\ \text{otherwise } 6 - y \end{vmatrix}$ | $x_{1b}(y) = \begin{vmatrix} 8 - y \text{ if } y \leq \frac{n}{2} \\ \text{otherwise } y + 1 \end{vmatrix}$ |
| $x_1(y) = \{1, 2, 2, 1\}$ | $x_{1b}(y) = \{6, 5, 5, 6\}$ |
| $i = 2$ | $i = 2$ |
| $y = \{3, 4\}$ | $y = \{3, 4\}$ |
| $x_2(y) = \begin{vmatrix} y-2 \text{ if } y \leq \frac{n}{2} \\ \text{otherwise } 5 - y \end{vmatrix}$ | $x_{2b}(y) = \begin{vmatrix} 9 - y \text{ if } y \leq \frac{n}{2} \\ \text{otherwise } y + 2 \end{vmatrix}$ |
| $x_2(y) = \{1, 1\}$ | $x_{2b}(y) = \{6, 6\}$ |

Consequently, a wiring pattern as shown in FIG. 9 is generated. The separated chains $y_1(x)-y_3(x)$, $y_{1b}(x)-y_{3b}(x)$, $x_1(y)-x_2(y)$ and $x_{1b}(y)$, $x_{2b}(y)$ can be connected with each other.

Figure 10:
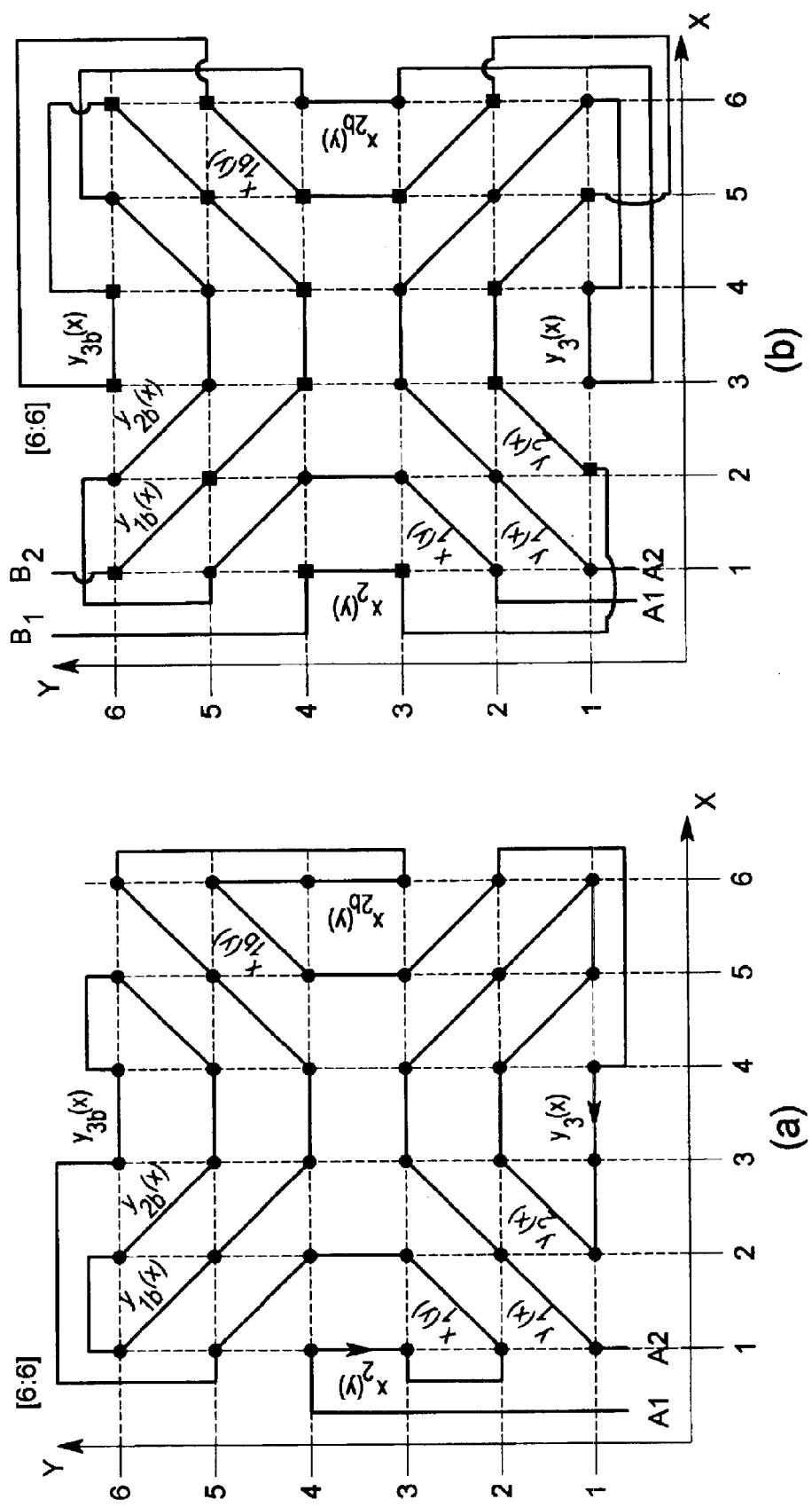
FIG. 10a, 10b show further wiring patterns for wiring cell elements according to the present invention.

FIG. 10a shows a possible wiring patent according to the present invention, wherein the cell elements are connected in a meandrous form. The generated series connection of the cell elements has two terminals A1, A2.

In FIG. 10b, another possible wiring structure according to the present invention is shown wherein two chains of cell elements are interlocked with each other. Each chain comprises a plurality of cell elements which are connected in series to each other. The first chain has terminals A1, A2 and the second chain has terminals B1, B2.

Figure 11:
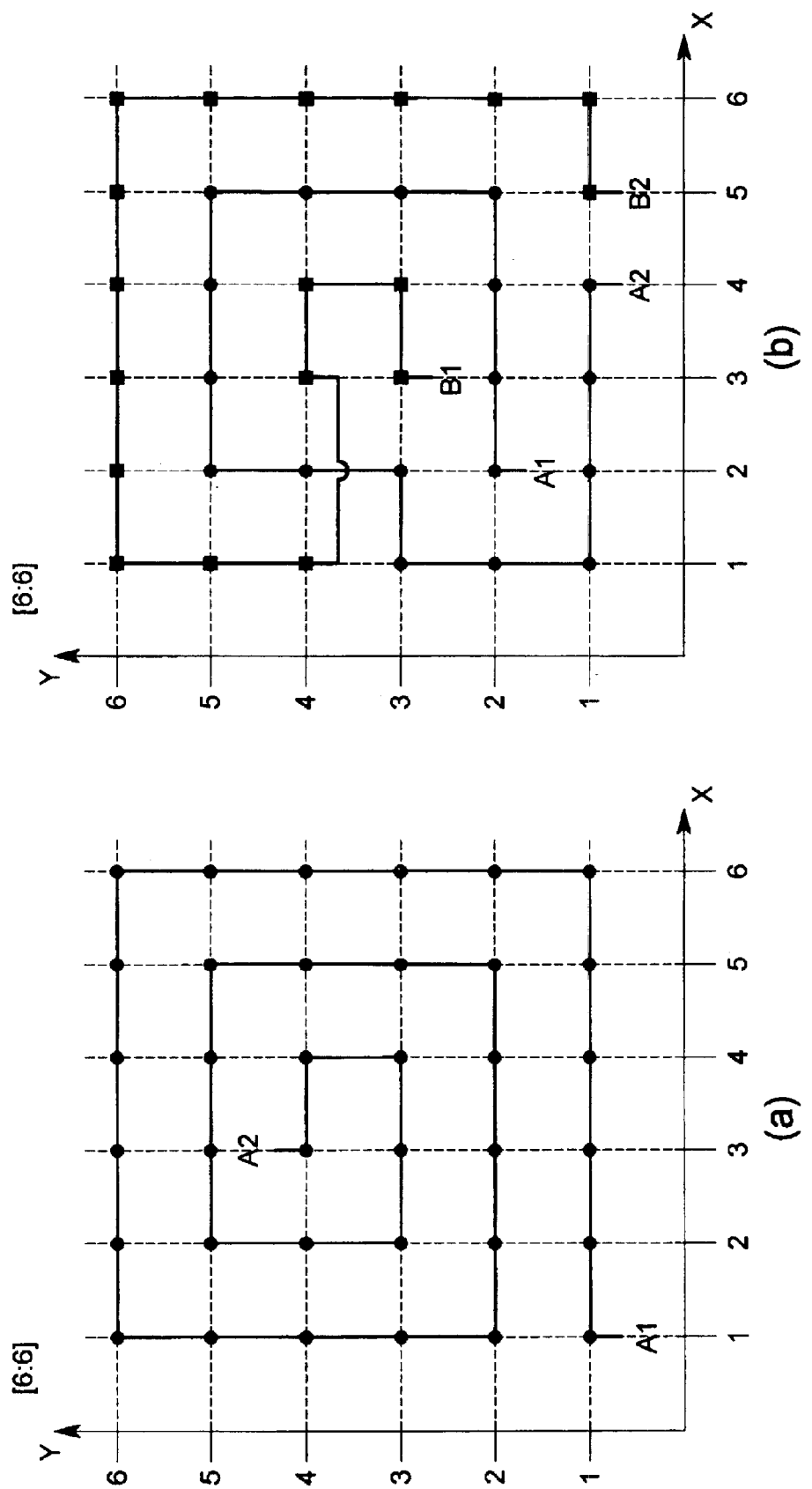
FIG. 11a, 11b show further wiring patterns for wiring cell elements in a cell array according to the present invention.

FIG. 11a shows a further embodiment of a wiring pattern according to the present invention. In this embodiment, the cell elements are connected in series in a helical form wherein the cell element chain has two terminals A1, A2.

FIG. 11b shows a further embodiment of the wiring pattern according to the present invention wherein two helical chains are interlocked with each other. The first cell element chain comprises terminals A1, A2 and the second cell element chain comprises terminals B1, B2.

Figure 12:
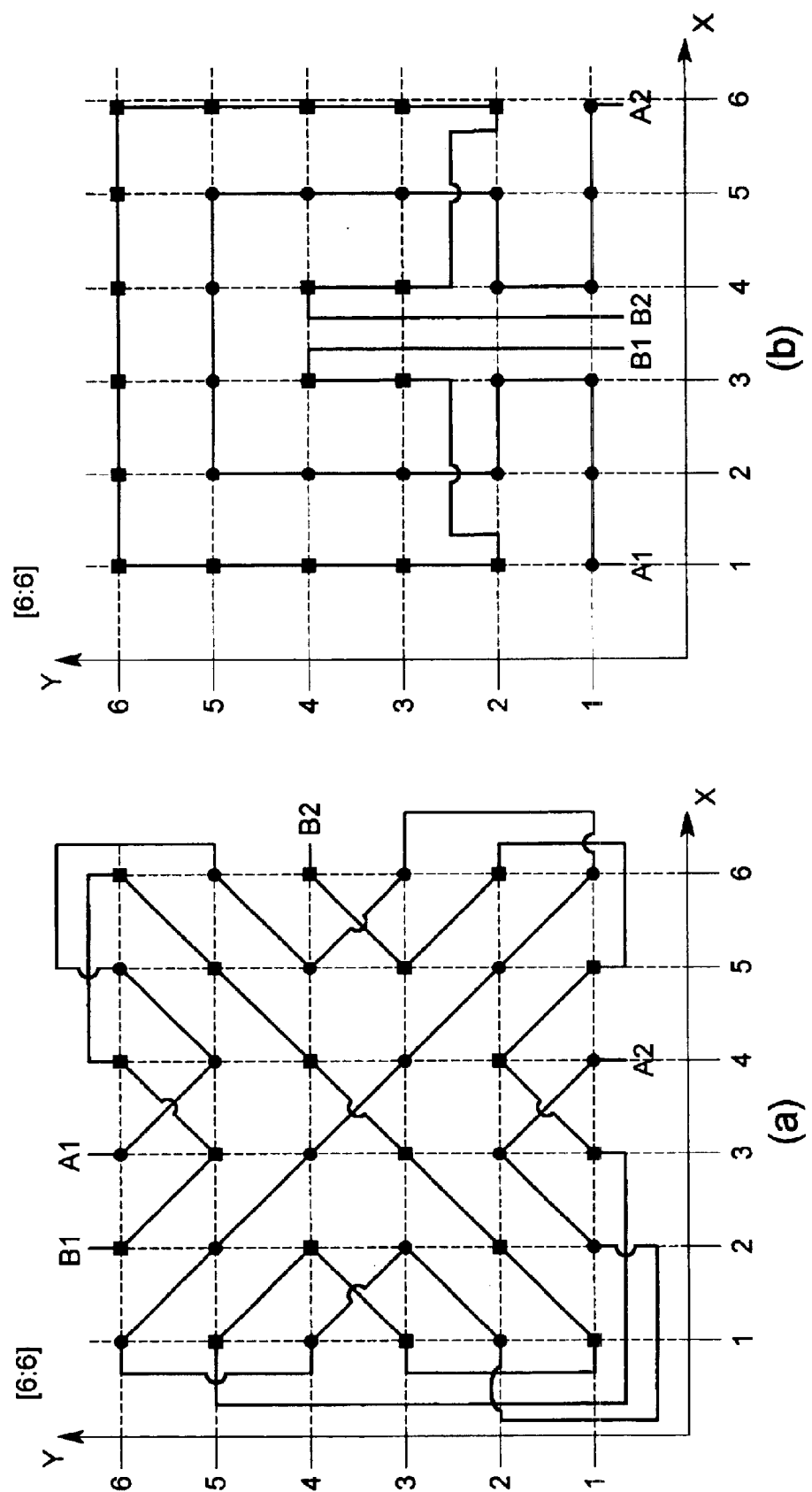
FIG. 12a, 12b show further wiring patterns for wiring cell elements in a cell array according to the present invention.

FIG. 12a shows a further wiring pattern according to the present invention with two interlocked cell element chains wherein the cell elements are connected to each other along diagonals having 45 degrees with respect to the rows and columns of the matrix. The structure has the advantage that each cell element of a chain has both cell elements of its own chain and cell elements of the other chain as neighboring cell elements. This provides in particular an advantage when two cell elements of the cell matrix are interacting.

FIG. 12b shows an alternative wiring structure with two interlocked cell element chains.

Each of the embodiments described above and shown in FIGS. 5, 6, 7, 9, 10a, 10b, 11a, 11b, 12a, 12b, as well as other embodiments described herein, have a wiring pattern or structure in which at least one row and column, and preferably most rows and columns, include more than two cross row and cross column connections. By contrast, the prior art wiring pattern in FIG. 4 shows only rows that have one or two cross row connections.

Figure 13:
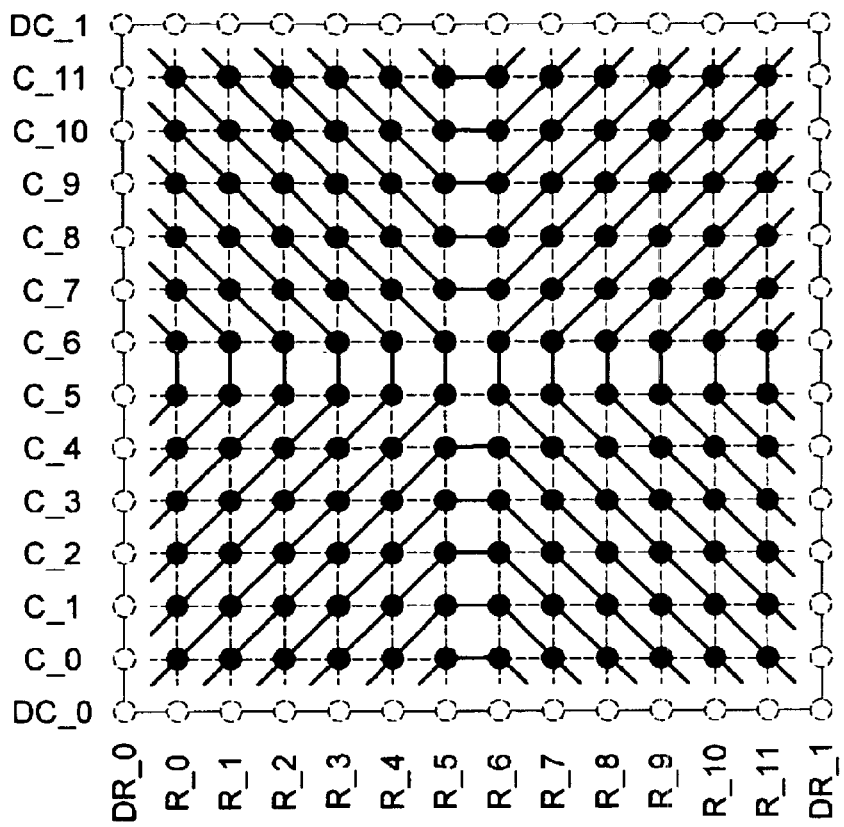
FIG. 13a, 13b show further wiring patterns for connecting cell elements within a cell array according to the present invention.
Figure 13:
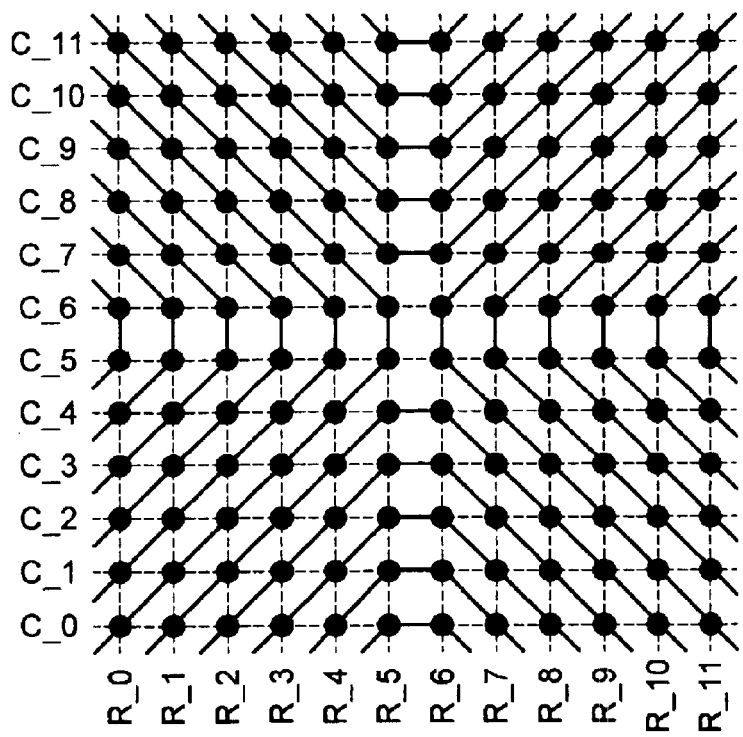

FIG. 13a, 13b show a 12×12 cell array having a wiring structure according to the present invention to improve the integral non-linearity of a thermometer-coded digital to analog converter.

In a preferred embodiment as shown in FIG. 13b, the integral non-linearity is improved by making sure that all cell elements within the cell array have the same environmental conditions. Cell elements placed at the border of the cell array as shown in FIG. 13a normally do not have the same environmental conditions like other cell elements within the cell array. To suppress these unequal conditions, dummy cell elements are placed around the cell array to form a border according to a preferred embodiment of the present invention.

FIG. 13b shows the configuration of the cell array with the active cell elements surrounded by dummy cell elements.

Figure 14:
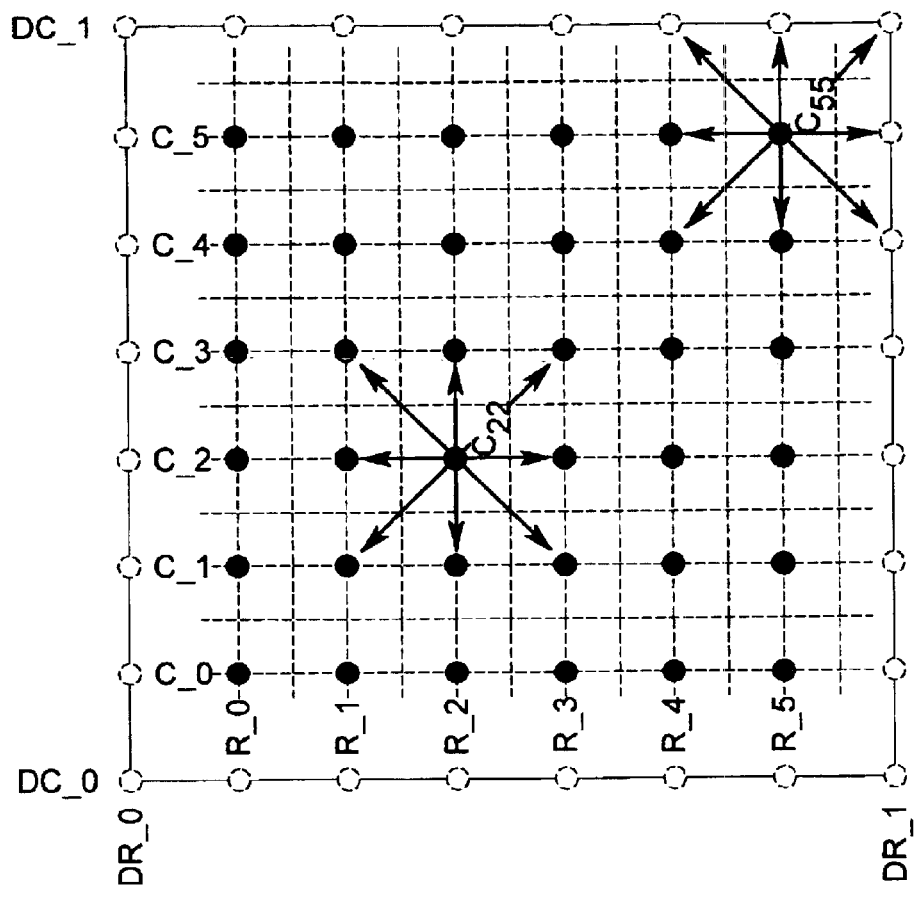
FIG. 14a, 14b show diagrams for illustrating the suppression effect by using dummy cells in a preferred embodiment of the cell array according to the present invention.
Figure 14:
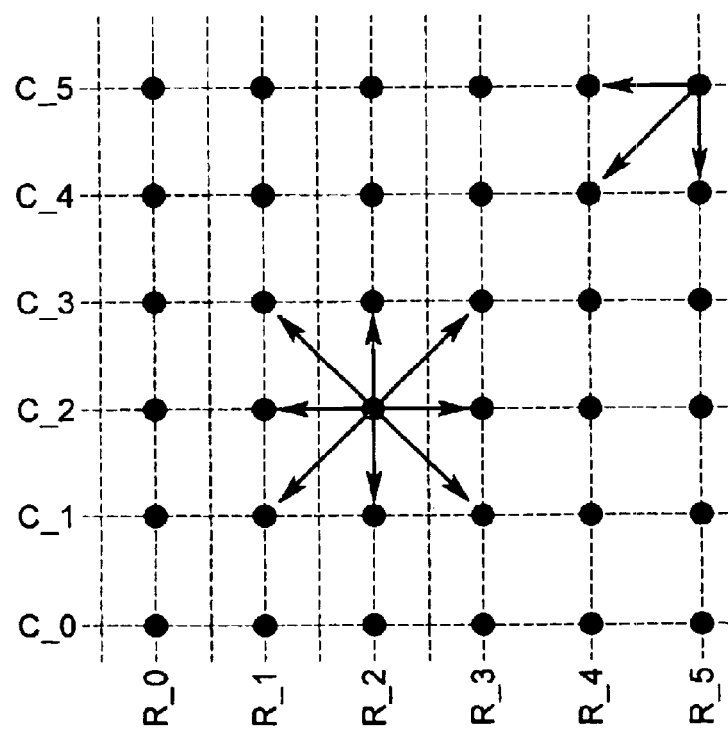

FIG. 14a, 14b show diagrams for illustrating the suppression of border effects in a 6×6 cell element matrix. Inner cell elements are surrounded on all sides by further cell elements, as can be seen in FIG. 14a. Cell elements at the border of the cell array, such as the cell element $C_{55}$, are not completely surrounded by other cell elements. To provide equal conditions for all cell elements, dummy cells are placed to surround the cell array. As can be seen in FIG. 14b, the cell element $C_{55}$ is surrounded by three active cell elements and five dummy cell elements. Accordingly, the bordering cell element $C_{55}$ is completely surrounded by cell elements and has the same conditions as for instance cell element $C_{22}$ within the cell array.

Figure 15:
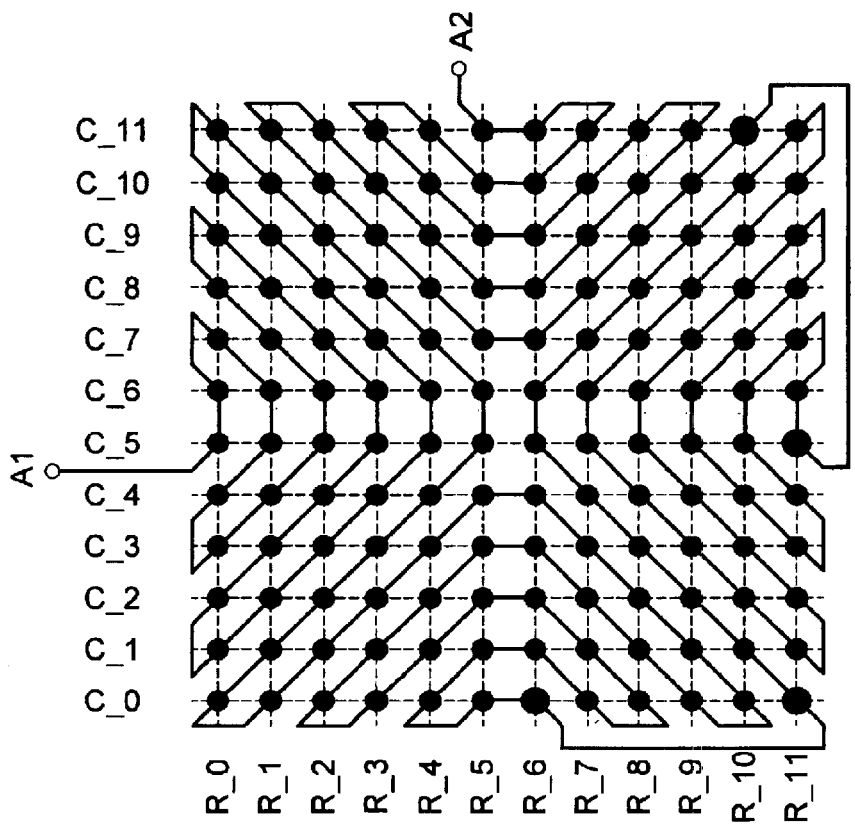
FIG. 15a, 15b show wiring patterns for connecting cell elements within a cell array according to the present invention.
Figure 15:
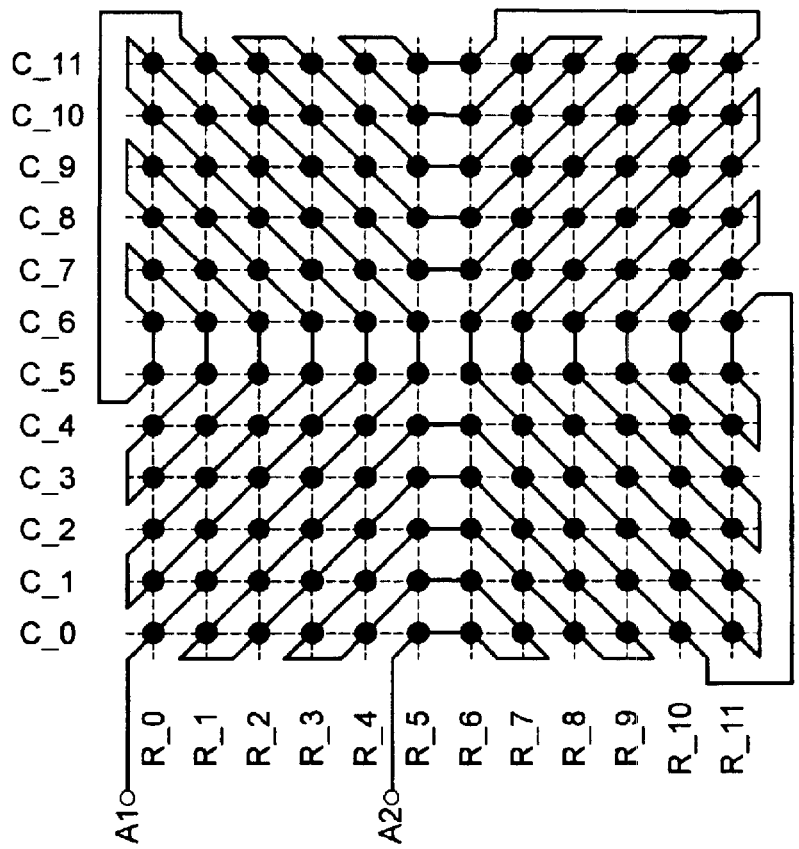

FIG. 15a shows a preferred embodiment of a cell array having a wiring pattern according to the present invention. The cell elements are connected in such a manner that all triangular configurations are bound together.

FIG. 15b shows a further embodiment with an improved interconnection of the triangular configuration wherein only two long-distance interconnections are provided. The first long-distance interconnection is between cell elements $C_{0,6}$ and $C_{0,11}$ and the second long-distance interconnection is between cell elements $C_{5,11}$ and $C_{11,10}$.

Figure 16:
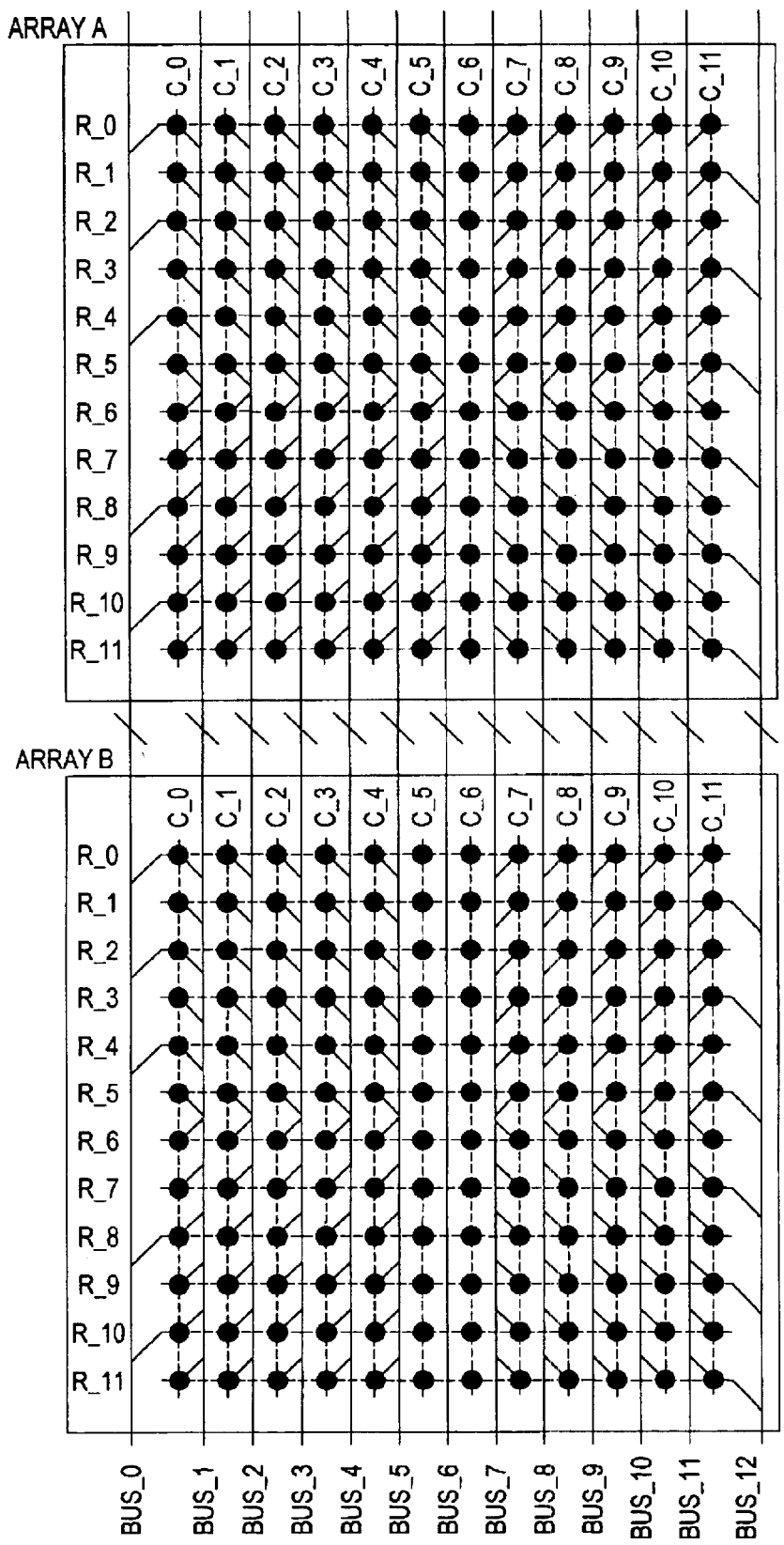
FIG. 16 shows an interconnection of a first cell array to relevant interconnections of a second cell array according to the present invention via busses.

FIG. 16 shows the possibility of interconnecting two cell arrays according to the present invention in parallel. A cell array A according to the present invention is interconnected to a cell array B according to the present invention via busses $Bus_0$ to $Bus_{12}$. This is advantageous if different cell elements are to be used together within an additional Digital-analog converter.

Figure 17:
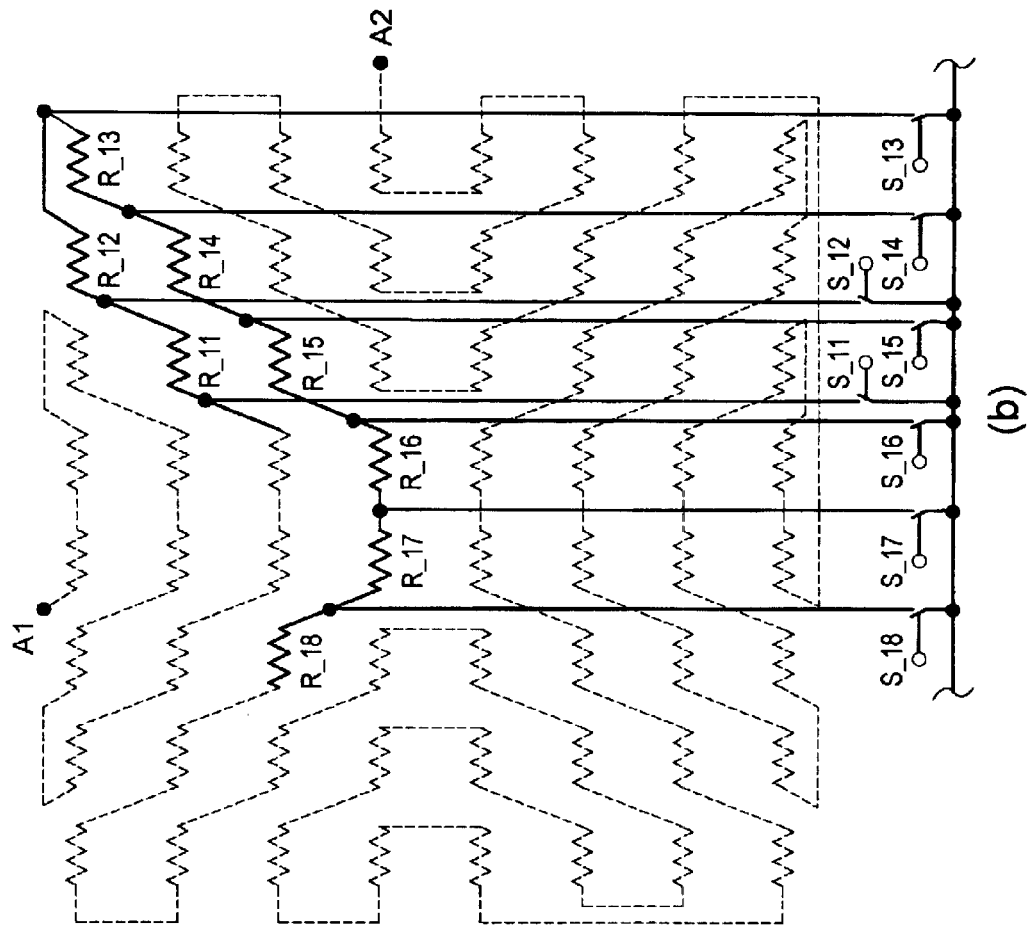
FIG. 17a, 17b show resistor strings which are connected in series and shorted by switches according to an embodiment of the present invention.
Figure 17:
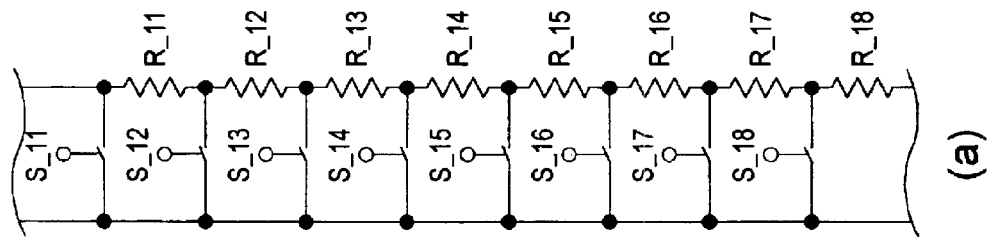

FIG. 17a shows a first resistor string within series-connected resistors $R_{11}-R_{18}$ which can be shorted by using bridging switches $S_{11}-S_{18}$. As can be seen in FIG. 17b in the shown embodiment, the switches $S_{11}-S_{18}$ are placed separately outside the resistor array according to an embodiment of the present invention.

Figure 18:
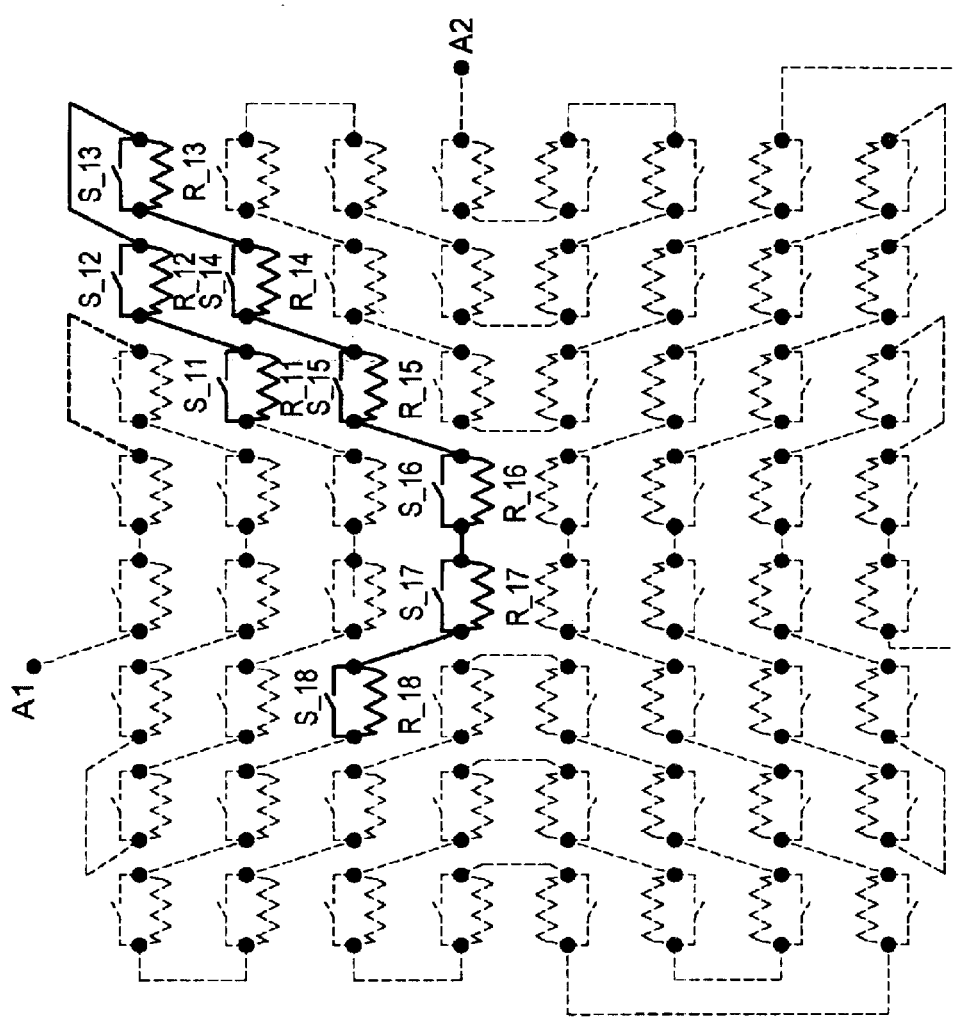
FIG. 18a, 18b show an embodiment of a cell array employing the resistors as cell elements according to an embodiment of the present invention.
Figure 18:
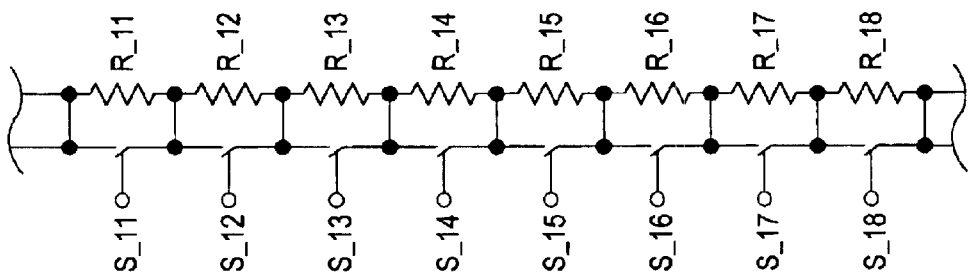

FIG. 18a, 18b show an alternative embodiment wherein the switches $S_{11}-S_{18}$ are placed inside the resistor array according to the present invention.

Figure 19:
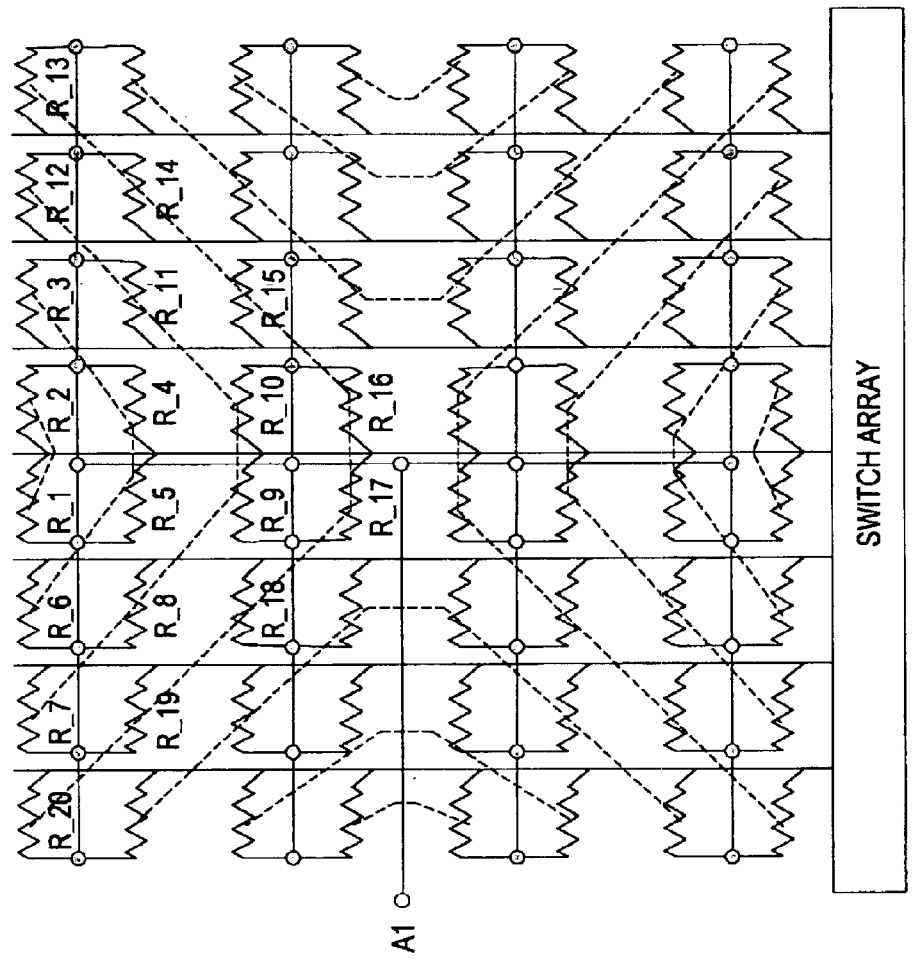
FIG. 19a, 19b show a cell array employing resistors as cell elements according to a further embodiment of the present invention.
Figure 19:
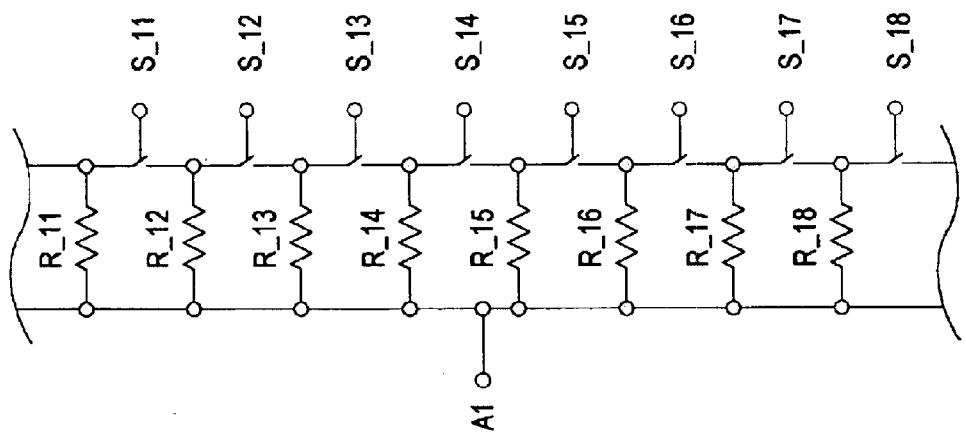

FIG. 19a shows a different version of the embodiment shown in FIG. 17a, wherein the switches and the resistors are interchanged. This configuration results in a different interconnection of the cell elements. The resistors in the cell array as shown in FIG. 19a are placed in the same manner as the cell elements in FIG. 17b.

Figure 20:
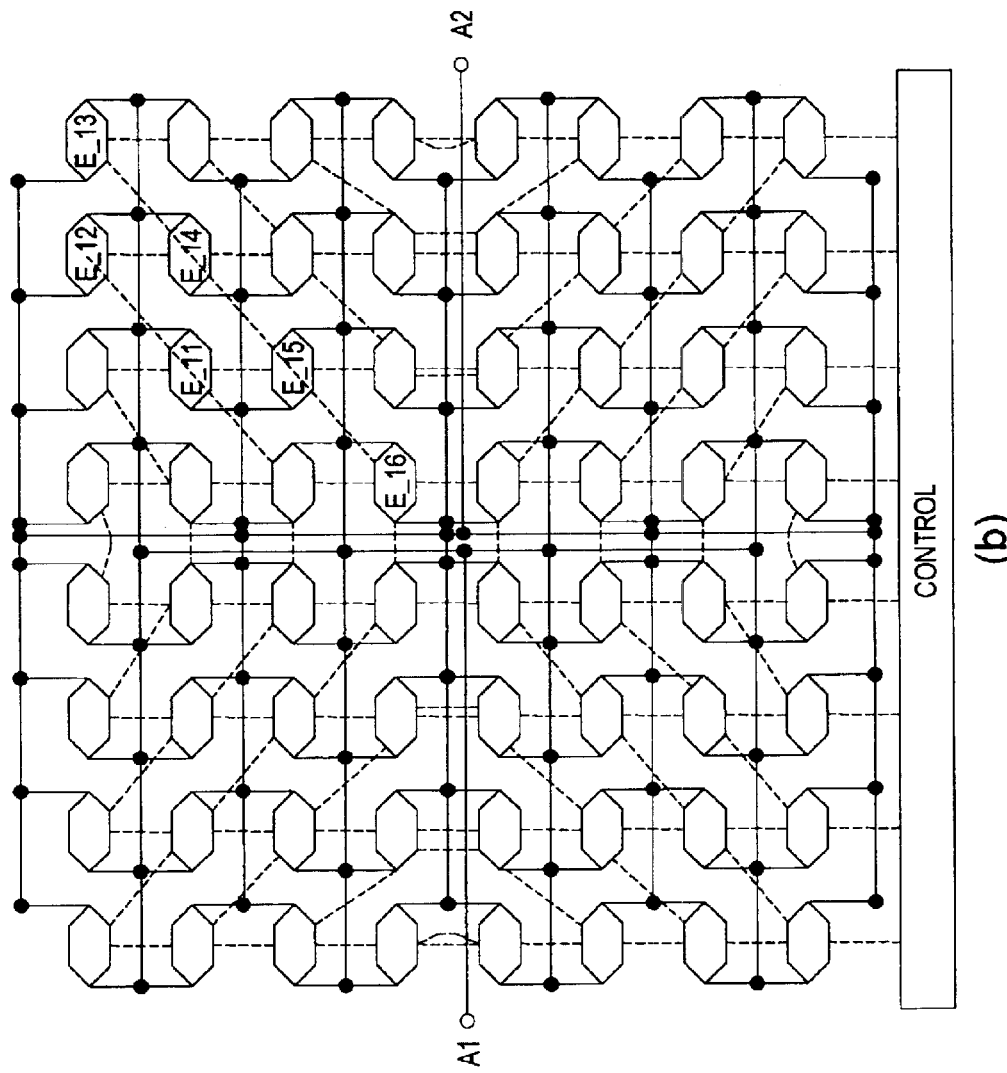
FIG. 20 shows a further embodiment of a cell array employing resistors as a cell element according to the present invention.
Figure 20:
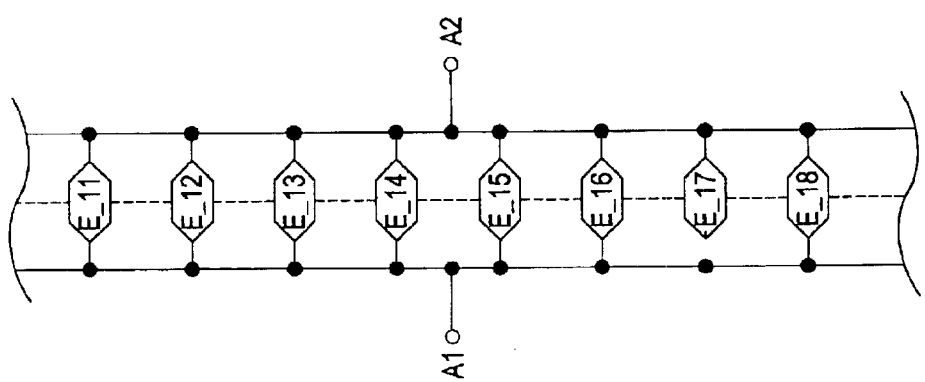

FIG. 20b shows a more general configuration of the cell elements which are connected in parallel and controlled via a bus. The integral non-linearity is reduced by applying a wiring pattern according to the present invention. In preferred embodiments, the shown cell arrays are surrounded by dummy cell elements which are identical with the cell elements inside the active cell array.

Figure 21:
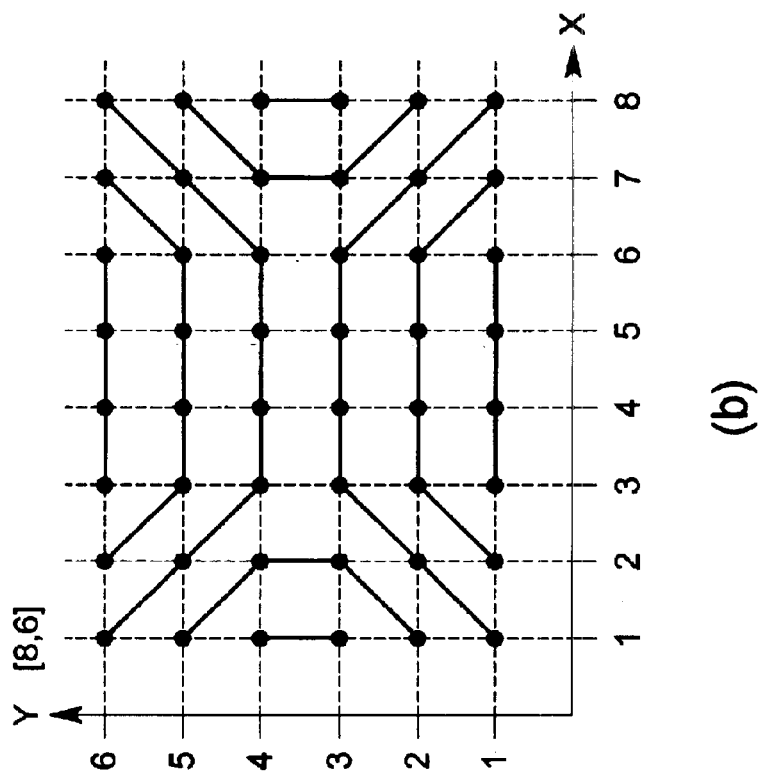
FIG. 21a, 21b show a cell array according to the present invention wherein the number of columns deviates from the number of rows.
Figure 21:
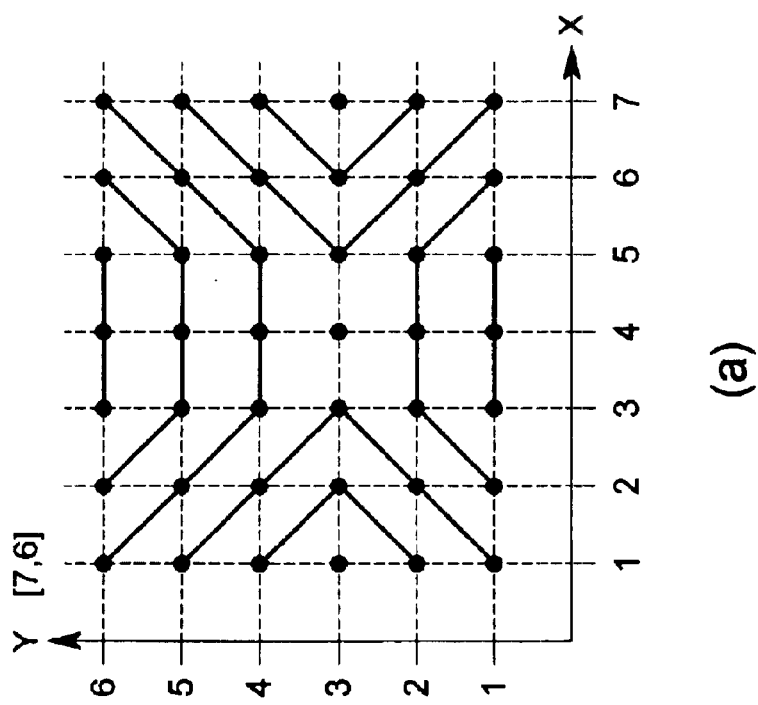

FIG. 21 shows a cell array with a wiring pattern according to the present invention wherein the cell array has a different number of cell columns and cell rows.

In the example shown in FIG. 21a, the cell array comprises seven columns and six rows of cell elements.

In the example shown in FIG. 21b, the cell array comprises eight rows of cell elements and six rows of cell elements. Accordingly, the present invention as applicable also for cell arrays where the number of rows and columns is different.

Figure 22:
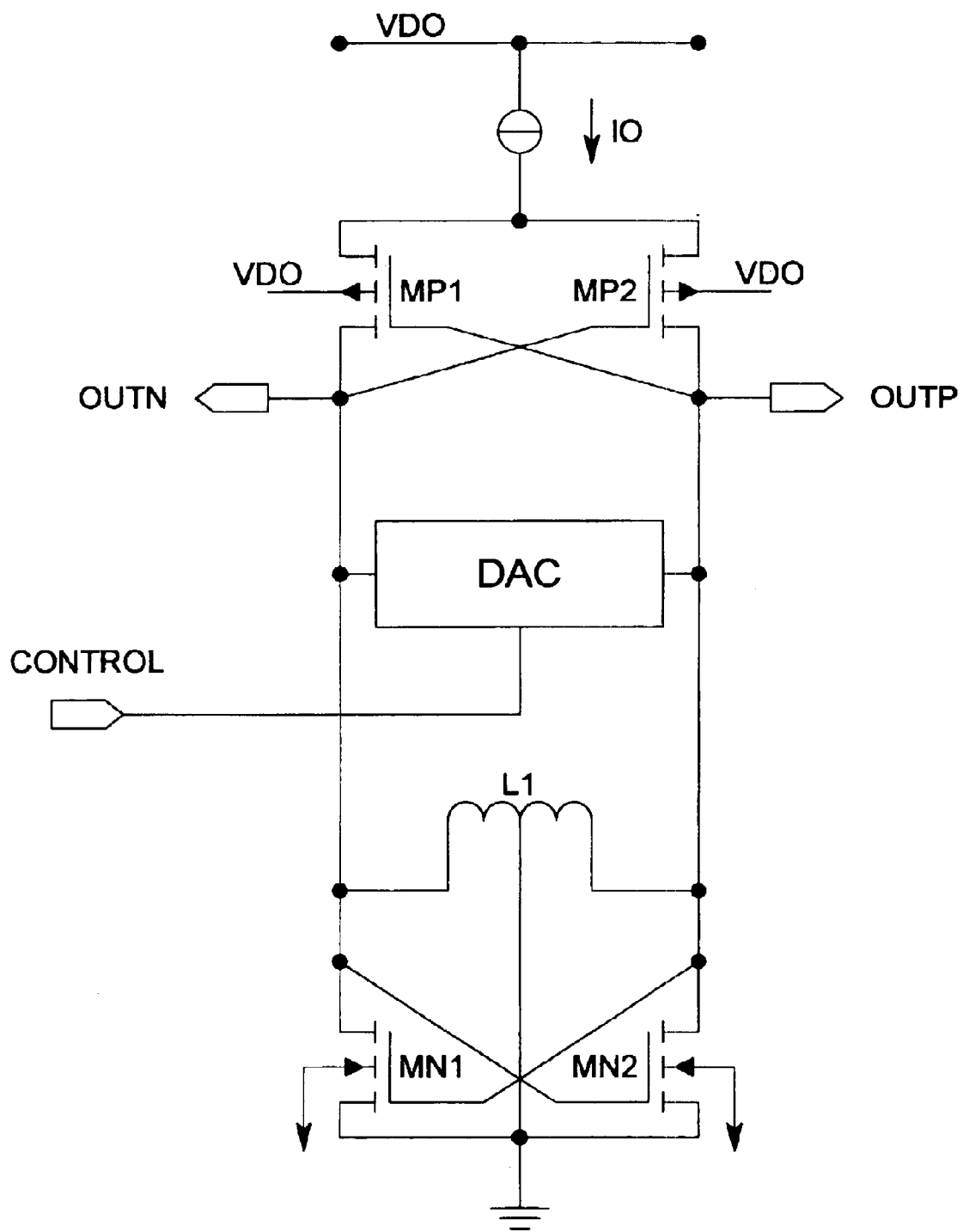
FIG. 22 shows a digital controller varactor circuit employing a digital to analog converter having a cell array according to the present invention.

FIG. 22 shows an digital to analog converter (DAC) having a cell matrix according to the present invention within an application circuit. The fundamental frequency of an LC oscillator is controlled by changing the effective capacity between the output nodes out n/out p. The fundamental frequency of the oscillator is controlled by the digital analog converter (DAC). The cell elements of the cell matrix within the digital to analog converter (DAC) are varactors which are placed and wired within the cell matrix according to one of the wiring pattern outlined above.

Figure 23:
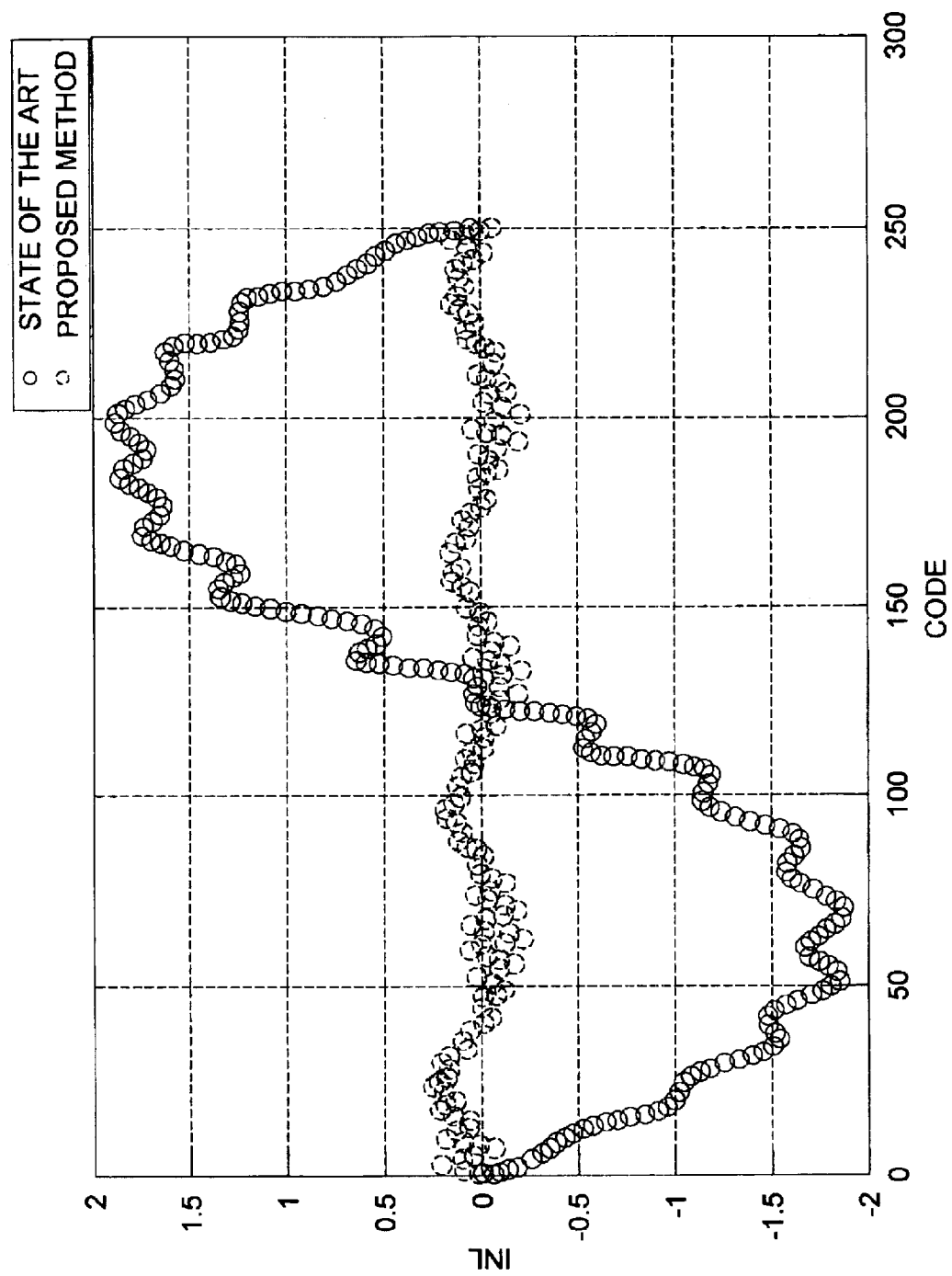
FIG. 23 shows a diagram showing the improvement of the integrated non-linearity of a digital to analog converter comprising the cell array according to the present invention.

FIG. 23 shows the integrated non-linearity (INL) of a 16×16 bidimensional cell array according to the present invention in comparison to the integral non-linearity of a cell array which is wired in a conventional manner as shown in FIG. 4. As can be seen from FIG. 23, the integrated non-linearity for the cell matrix employing a wiring pattern according to the present invention is drastically reduced.

Figure 24:
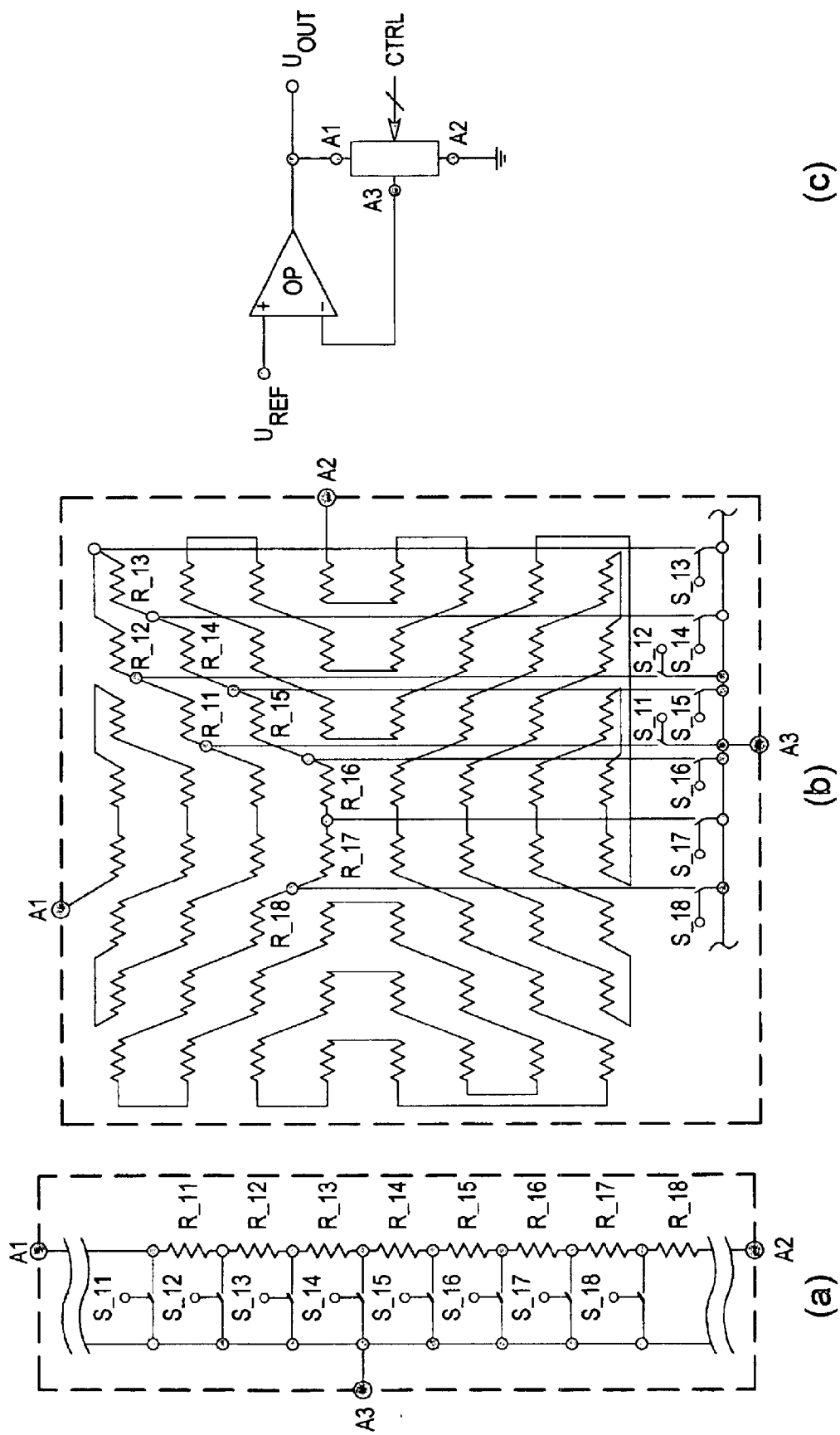
FIG. 24 shows an amplifier circuit according to the present invention comprising a cell array according to the present invention.

FIG. 24 shows an amplifying circuit comprising a cell array according to the present invention. FIG. 24a shows the logical structure of a part of the cell array according to the present invention.

FIG. 24b shows the topology of a preferred embodiment of the cell array according to the present invention wherein the resistors are connected in series and can be short-circuited by switches which are provided outside the cell array. The cell array comprises three terminals A1, A2, A3.

As can be seen from FIG. 24c, the non-inverting amplifying circuit comprises an operation amplifier OP, the output terminal of which is connected to terminal A1 of the cell array as shown in FIG. 24b. The non-inverting input of the operation amplifier receives a reference voltage. The inverting input of the operation amplifier is connected to terminal A3 of the cell array. The terminal A2 of the cell array is connected to ground. A digital control signal for controlling the switches is supplied to the cell array.

Figure 25:
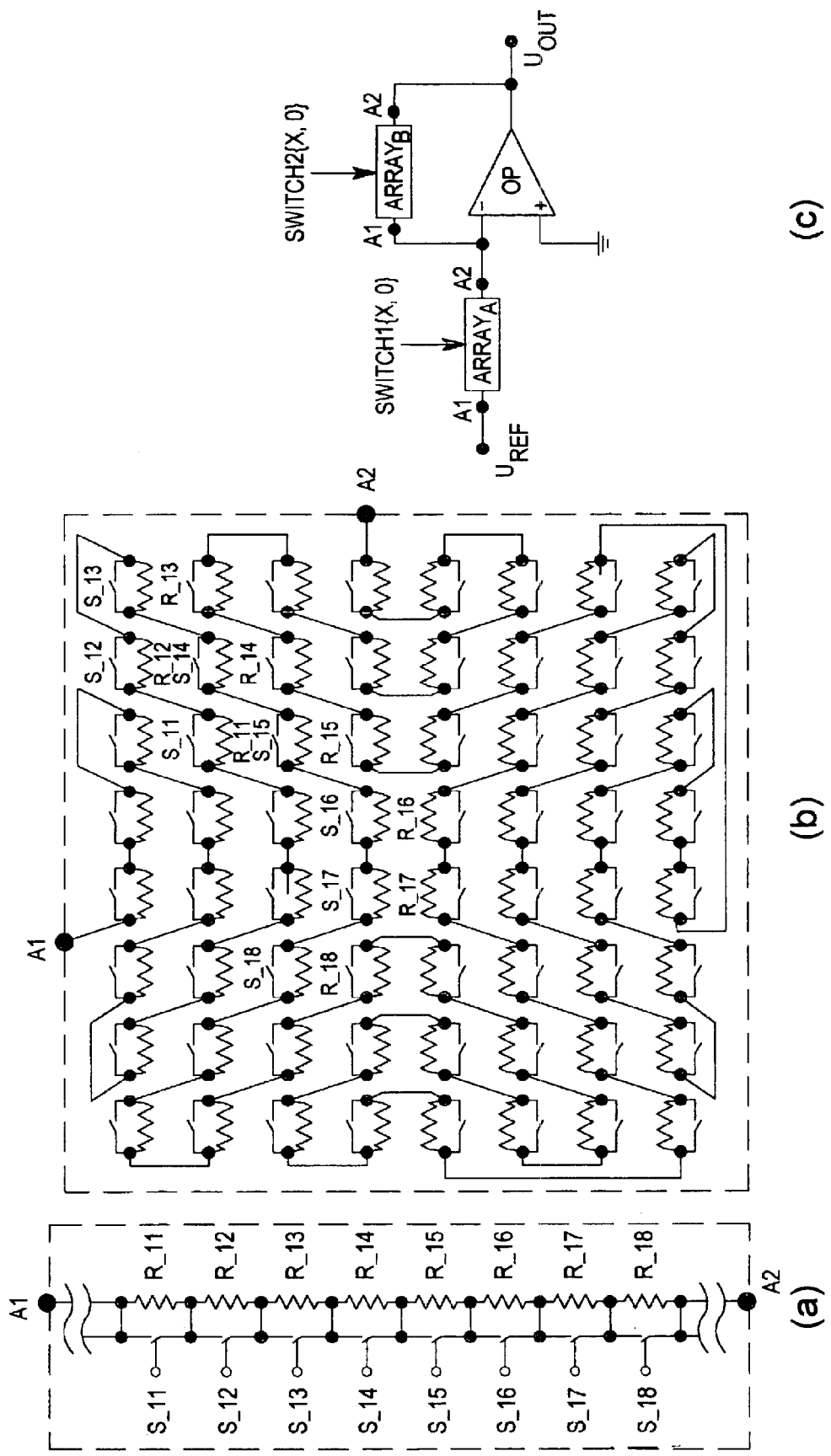
FIG. 25 shows an inverting amplifying circuit comprising cell arrays according to the present invention.

FIG. 25 shows an inverting amplifying circuit employing two cell arrays having a topology according to the present invention.

FIG. 25a shows a part of a chain of cell elements which are bridgeable by means of switches.

FIG. 25b shows an embodiment of a cell array having a wiring pattern or wiring structure according to the present invention. The cell array comprises two terminals A1, A2 which are connected to each other by a chain of resistors which are connected in series according to a wiring pattern according to the present invention. In the given example, the cell array comprises 8×8 resistors so that the resistor chain comprises 64 resistors connected in series. To each resistor a corresponding switch is connected in parallel and can be controlled by an external digital signal. In the embodiment shown in FIG. 25b, 64 switches are integrated in the cell array.

The inverting amplifying as shown in FIG. 25c comprises two cell arrays (array A, array B), wherein each array A, B has the topology as shown in FIG. 25b. The first array A is connected between a reference voltage and an inverting input of the operation amplifier OP. The second array B is connected between the output of the operation amplifier and the inverting input of the operation amplifier. The non-inverting input of the operation amplifier OP is connected to ground. The gain of the inverting amplifying circuit is controlled by the digital signals applied to both arrays A, B.

What is claimed is:

1. A cell array having a plurality of cell elements integrated on a wafer in a bidimensional cell matrix, at least one integrated cell element exhibiting a mismatch between its actual physical property and a nominal property value, the mismatch of the at least one cell element being a function of the distance of the respective cell element to a center of the cell array having a bidimensional mismatch distribution, the plurality of cell elements arranged in rows and columns; wherein the cell elements are connected in series in a wiring pattern in which, for a plurality of rows of cell elements, each row of cell elements includes more than two series connections to cell elements of one or more other rows, and for a plurality of columns of cell elements, each column of cell elements includes more than two series connections to cell elements of one or more other columns; and wherein the cell matrix comprises a first number (N) of cell element rows and a second number (M) of cell element columns, and wherein the first number (N) of cell element rows is equal to the second number (M) of cell element columns.

2. A cell array having a plurality of cell elements integrated on a wafer in a bidimensional cell matrix, at least one integrated cell element exhibiting a mismatch between its actual physical property and a nominal property value, the mismatch of the at least one cell element being a function of the distance of the respective cell element to a center of the cell array having a bidimensional mismatch distribution, the plurality of cell elements arranged in rows and columns; wherein the cell elements are connected in series in a wiring pattern in which, for a plurality of rows of cell elements, each row of cell elements includes more than two series connections to cell elements of one or more other rows, and for a plurality of columns of cell elements, each column of cell elements includes more than two series connections to cell elements of one or more other columns; and wherein the cell array is surrounded by dummy cell elements.

3. A cell array having a plurality of cell elements integrated on a wafer in a bidimensional cell matrix, at least one integrated cell element exhibiting a mismatch between its actual physical property and a nominal property value, the mismatch of the at least one cell element being a function of the distance of the respective cell element to a center of the cell array having a bidimensional mismatch distribution, the plurality of cell elements arranged in rows and columns; wherein the cell elements are connected in series in a wiring pattern in which, for a plurality of rows of cell elements, each row of cell elements includes more than two series connections to cell elements of one or more other rows, and for a plurality of columns of cell elements, each column of cell elements includes more than two series connections to cell elements of one or more other columns; and wherein the wiring pattern includes at least three series connected cell elements that are successively displaced from each other by one row and one column.

4. The cell array according to claim 3, wherein the wiring pattern includes at least a portion that connects cells in a meandrous form.

5. The cell array according to claim 3, wherein the wiring pattern includes at least a portion that connects cells in a helical form.

6. The cell array according to claim 3, wherein each cell element of the integrated cell array is bridgeable by a corresponding switch.

7. The cell array according to claim 6, wherein the corresponding switch is provided within the integrated cell array.

8. The cell array according to claim 6, wherein the corresponding switch is provided outside the integrated cell array.

9. A cell array having a plurality of cell elements integrated on a wafer in a bidimensional cell matrix, at least one integrated cell element exhibiting a mismatch between its actual physical property and a nominal property value, the mismatch of the at least one cell element being a function of the distance of the respective cell element to a center of the cell array having a bidimensional mismatch distribution, the plurality of cell elements arranged in rows and columns, wherein the cell elements are connected in series in a wiring pattern in which, for a plurality of rows of cell elements, each row of cell elements includes more than two series connections to cell elements of one or more other rows, and for a plurality of columns of cell elements, each column of cell elements includes more than two series connections to cell elements of one or more other columns; and wherein the cell elements comprise capacitors.

10. A cell array having a plurality of cell elements integrated on a wafer in a bidimensional cell matrix, at least one integrated cell element exhibiting a mismatch between its actual physical property and a nominal property value, the mismatch of the at least one cell element being a function of the distance of the respective cell element to a center of the cell array having a bidimensional mismatch distribution, the plurality of cell elements arranged in rows and columns; wherein the cell elements are connected in series in a wiring pattern in which, for a plurality of rows of cell elements, each row of cell elements includes more than two series connections to cell elements of one or more other rows, and for a plurality of columns of cell elements, each column of cell elements includes more than two series connections to cell elements of one or more other columns; and wherein the cell elements comprise varactors.

11. A cell array having a plurality of cell elements integrated on a wafer in a bidimensional cell matrix, at least one integrated cell element exhibiting a mismatch between its actual physical property and a nominal property value, the mismatch of the at least one cell element being a function of the distance of the respective cell element to a center of the cell array having a bidimensional mismatch distribution, the plurality of cell elements arranged in rows and columns; wherein the cell elements are connected in series in a wiring pattern in which, for a plurality of rows of cell elements, each row of cell elements includes more than two series connections to cell elements of one or more other rows, and for a plurality of columns of cell elements, each column of cell elements includes more than two series connections to cell elements of one or more other columns; and wherein the cell elements comprise resistors.

12. A cell array having a plurality of cell elements integrated on a wafer in a bidimensional cell matrix, at least one integrated cell element exhibiting a mismatch between its actual physical property and a nominal property value, the mismatch of the at least one cell element being a function of the distance of the respective cell element to a center of the cell array having a bidimensional mismatch distribution, the plurality of cell elements arranged in rows and columns; wherein the cell elements are connected in series in a wiring, pattern in which, for a plurality of rows of cell elements, each row of cell elements includes more than two series connections to cell elements of one or more other rows, and for a plurality of columns of cell elements, each column of cell elements includes more than two series connections to cell elements of one or more other columns; and wherein the cell elements comprise current sources.

13. A cell array having a plurality of cell elements integrated on a wafer in a bidimensional cell matrix, at least one integrated cell element exhibiting a mismatch between its actual physical property and a nominal property value, the mismatch of the at least one cell element being a function of the distance of the respective cell element to a center of the cell array having a bidimensional mismatch distribution, the plurality of cell elements arranged in rows and columns; wherein the cell elements are connected in series in a wiring pattern in which, for a plurality of rows of cell elements, each row of cell elements includes more than two series connections to cell elements of one or more other rows, and for a plurality of columns of cell elements, each column of cell elements includes more than two series connections to cell elements of one or more other columns; and wherein the cell elements comprise transistors.

14. A cell array having a plurality of cell elements integrated on a wafer in a bidimensional cell matrix, at least one integrated cell element exhibiting a mismatch between its actual physical property and a nominal property value, the mismatch of the at least one cell element being a function of the distance of the respective cell element to a center of the cell array having a bidimensional mismatch distribution, the plurality of cell elements arranged in rows and columns; wherein the cell elements are connected in series in a wiring pattern in which, for a plurality of rows of cell elements, each row of cell elements includes more than two series connections to cell elements of one or more other rows, and for a plurality of columns of cell elements, each column of cell elements includes more than two series connections to cell elements of one or more other columns; and wherein the cell elements comprise diodes.

15. A digital to analog converter comprising:

a cell array having a plurality of cell elements integrated on a wafer in a bidimensional cell matrix, at least one integrated cell element exhibiting a mismatch between its actual physical property and a nominal property value, the mismatch of the at least one cell element being a function of the distance of the respective cell element to a center of the cell array having a bidimensional mismatch distribution, the plurality of cell elements connected in series in a wiring pattern; and a number of dummy cells extending around a perimeter of the cell array, wherein each of the dummy cell has nominal property values substantially equivalent to one of the cell elements in the cell array.

16. The analog to digital converter according to claim 15 wherein the plurality of cell elements form a plurality of rows and a plurality of columns, and wherein:
- at least one dummy cell is disposed adjacent to first and second ends of each row; and
- at least one dummy cell is disposed adjacent to first and second ends of each column.

17. The digital-to-analog converter according to claim 16 wherein the plurality of cell elements form a plurality of rows and a plurality of columns, and wherein:
- at least one row of cell elements includes more than two series connections to cell elements of one or more other rows; and
- at least one column of cell elements includes more than two series connections to cell elements of one or more other columns.

* * * * *